(12) United States Patent
Dal Negro et al.

(10) Patent No.: US 11,294,195 B2
(45) Date of Patent: Apr. 5, 2022

(54) APERIODIC NANO-OPTICAL ARRAY FOR ANGULAR SHAPING OF INCOHERENT EMISSIONS

(71) Applicants: OSRAM Opto Semiconductors GmbH, Regensburg (DE); Trustees of Boston University, Boston, MA (US)

(72) Inventors: Luca Dal Negro, Brookline, MA (US); Alan Lenef, Belmont, MA (US); Madis Raukas, Lexington, MA (US); Sean Gorsky, Waltham, MA (US); Ran Zhang, Allston, MA (US)

(73) Assignees: OSRAM Opto Semiconductors GmbH, Regensburg (DE); Trustees of Boston University, Boston, MA (US)

( * ) Notice: Subject to any disclaimer, the term of this patent is extended or adjusted under 35 U.S.C. 154(b) by 0 days.

(21) Appl. No.: 16/181,284

(22) Filed: Nov. 5, 2018

(65) Prior Publication Data
US 2020/0142209 A1    May 7, 2020

(51) Int. Cl.
*G02B 27/30* (2006.01)
*F21K 9/64* (2016.01)
*F21K 9/65* (2016.01)
*G02B 27/42* (2006.01)
*C09K 11/77* (2006.01)

(52) U.S. Cl.
CPC .............. *G02B 27/30* (2013.01); *F21K 9/64* (2016.08); *F21K 9/65* (2016.08); *G02B 27/42* (2013.01); *C09K 11/7721* (2013.01)

(58) Field of Classification Search
CPC ........... G02B 27/30; G02B 27/42; F21K 9/64; F21K 9/65
See application file for complete search history.

(56) References Cited

U.S. PATENT DOCUMENTS

| 7,663,152 | B2 | 2/2010 | Bierhuizen et al. |
| 9,360,597 | B2 | 6/2016 | Dal Negro |
| 9,688,910 | B2 | 6/2017 | Eberhardt et al. |
| 2007/0085098 | A1 | 4/2007 | Erchak et al. |
| 2011/0285991 | A1 | 11/2011 | Dal Negro et al. |

(Continued)

FOREIGN PATENT DOCUMENTS

WO    2015091393 A1    6/2015

OTHER PUBLICATIONS

Lawrence, N. et al., "Aperiodic arrays for active nanopillars for radiation engineering," J. App. Phys. 111, 113101, 2012 (Year: 2012).*

(Continued)

*Primary Examiner* — Rajarshi Chakraborty
*Assistant Examiner* — Nathaniel J Lee
(74) *Attorney, Agent, or Firm* — Slater Matsil, LLP

(57) ABSTRACT

Disclosed herein are a number of dielectric pillars, arranged to form a close-packed aperiodic array, such as a Vogel spiral, where the geometries of the aperiodic array produce azimuthally isotropic scattering of luminescence within a restricted angular cone of extraction. The aperiodic array can be formed, attached or placed on a converting material, such as, phosphor, to restrict emission to within the angular cone of extraction. The phosphor could be part of a converting illumination device, such as a phosphor coated light emitting diode, or a laser activated remote phosphor converting device.

27 Claims, 14 Drawing Sheets

(56) References Cited

U.S. PATENT DOCUMENTS

| | | | |
|---|---|---|---|
| 2012/0086036 A1* | 4/2012 | Jo | H01L 33/0095 |
| | | | 257/98 |
| 2012/0261688 A1* | 10/2012 | Raukas | H01L 33/505 |
| | | | 257/98 |
| 2012/0322164 A1* | 12/2012 | Lal | H01L 29/0676 |
| | | | 436/501 |
| 2013/0026911 A1 | 1/2013 | Chiang et al. | |
| 2014/0016181 A1* | 1/2014 | Dal Negro | G02B 5/008 |
| | | | 359/298 |
| 2014/0362600 A1* | 12/2014 | Suckling | F21S 41/16 |
| | | | 362/583 |
| 2016/0202401 A1 | 7/2016 | Christiansen et al. | |
| 2017/0082263 A1 | 3/2017 | Byrnes et al. | |
| 2018/0106932 A1 | 4/2018 | Schill et al. | |

OTHER PUBLICATIONS

Lenef, A., et al., "Thermodynamics of Light Extraction from Luminescent Materials," ECS Journal of Solid State Science and Technology, 7(1) R1-R16, 2018.

Lawrence, N., et al., "Aperiodic arrays for active nanopillars for radiation engineering," J. App. Phys. 111, 113101, 2012, 9 pages.

Hollenhauer, Ralf, International Search Report and Written Opinion of the International Searching Authority, for counterpart application PCT/US2019/057580, dated Feb. 7, 2020, European Patent Office, Rijswijk, The Netherlands, 13 pages.

S. Yerci, et al., "Energy transfer and 1.54 μm emission in amorphous silicon nitride films," Applied Physics Letters, vol. 95, Issue 3, Jul. 22, 2009, pp. 031107-1- 031107-3.

* cited by examiner

Aperiodic Array *321*  Pillar 301

Aperiodic Array *322*  Pillar 302

Aperiodic Array *323*  Pillar 303

APERIODIC NANO-OPTICAL ARRAY FOR ANGULAR SHAPING OF INCOHERENT EMISSIONS

TECHNICAL FIELD

Embodiments herein generally relate to structures formed upon surfaces to shape light emitted from a luminescent source.

BACKGROUND

Many modern systems implement some form of photonics. For example, many modern electronic devices include some form of light generation. A significant problem in a number of light emission systems (e.g., projectors, automotive headlights, structured lighting systems, etc.) is that emission from the light-emitting device occurs in a hemispherical distribution. As a consequence, efficient light collection from such light emitting devices at high collection angles is difficult. Typically, collimating optics for such systems include multiple aspheric lenses and large convex mirror structures. Thus, it is difficult to make compact light sources. For example, fabrication of low cost and/or small footprint collimating optics beyond angles of ±60° is exceedingly difficult, particularly when the numerical aperture exceeds 0.87. Furthermore, maintenance of high image quality or high contrast in any projected image is difficult. In some cases, not collecting light beyond ±60° results in a loss of approximately 25% of the total emitted light.

Some lighting applications utilize phosphor conversion materials to convert high power pump light into longer wavelength light. For example, blue or ultra violet (UV) light emitting diodes (LEDs) can be used to cause white or other desired longer wavelength emissions from phosphor materials. However, such converted light emission devices suffer similar problems to other light emission devices, in that collection of emissions at high-angles is a challenge. A variety of methods have been proposed to collect high-angle light emission from phosphor converted light sources.

For example, bonding a lens to the surface of the phosphor plate can improve light extraction from the phosphor into air, but at a large cost in luminance. The cost in luminance can be at least $(n_{lens}/n_{ph})^2$, where $n_{lens}$ is the refractive index of the lens material and $n_{ph}$ is the refractive index of the phosphor. As a specific example, consider the case of yttrium aluminum garnet (YAG) to silicone, which represents a luminance loss of roughly $(1.41/1.83)^2=0.59$. With longer wavelength phosphors (e.g., those using red-emitting nitrides) refractive indices are on the order of 2.0 to 2.2, resulting in an even greater luminance loss.

As another example, collecting high-angle emissions using external optics with very wide collection angles may mitigate the luminance reduction problem discussed above. However, depending upon the optics used, various disadvantages with respect to chromatic aberration, color separation, limited collection angles, cost, size, and weight are introduced. Furthermore, the etendue of a light source including a converted LED (e.g., phosphor converted LED, or the like) and external optics is limited by the etendue of the converted LED etendue. As such, the etendue will not decrease based on external optics.

In another example, a photonic lattice, constructed of pillars arranged in periodic arrays, can be applied to the surface of the phosphor. The photonic lattice functions similarly to a two dimensional (2D) grating, which can diffract the internal light distribution within the phosphor into desired emission directions. Such lattice structures can narrow emission angles in some cases, but several problems arise. First, the high symmetry of these structures along with the small number of discrete diffraction orders produces concentrations of light in the far-field emission. Second, as spatial periodic structures generate corresponding periodic scattering k-space vectors, possible scattering patterns for a given incident luminescent k-vector are limited. This effect limits the range of possible far-field patterns, including those that provide a narrow angular emission distribution in the far-field. Since the diffraction pattern choices are limited, it is very difficult to simultaneously achieve directional emission and high extraction efficiency. Third, as k-space vectors are sparsely filled for periodic structures, the highest extraction efficiency of emission with modified directionality cannot be achieved.

It is with respect to the above problems and difficulties that the present disclosure is provided.

DETAILED DESCRIPTION

Figure 1:
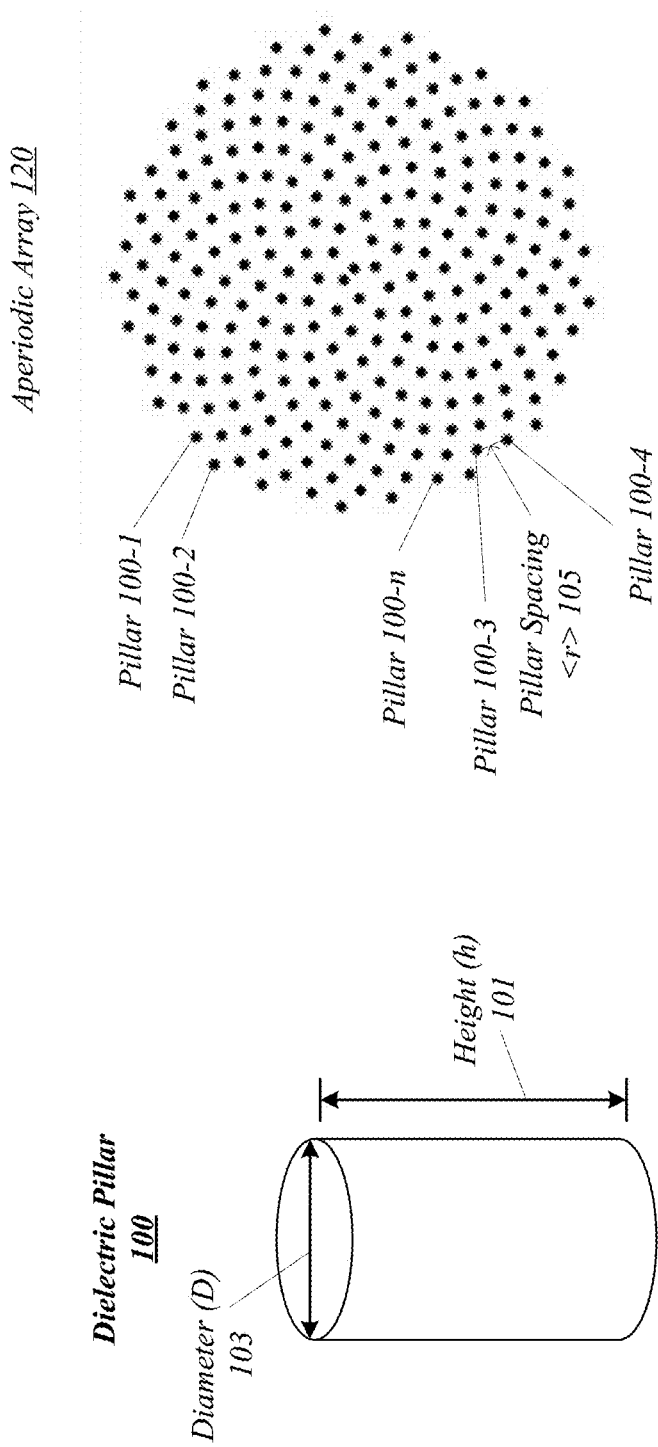
FIG. 1A illustrates an example of a dielectric pillar in accordance with various implementations.
FIG. 1B illustrates an example of an aperiodic array of a number of dielectric pillars in accordance with various implementations.

Various implementations are directed to aperiodic arrays applied to or formed on the emission side of an emitting or wavelength converting material surface. In general, the aperiodic array is formed from a number of nano-structures arranged in a two-dimensional (2D) aperiodic pattern. As noted, phosphor conversion materials are often used to convert pump light into a longer wavelength light to access spectral regions not available directly through electrical-to-light conversion (or providing light there with better efficiency). The present disclosure can be applied to light emission devices that use phosphor. For example, phosphor conversion from blue or UV LEDs is often used to generate white or other desired longer wavelength emissions. An aperiodic array of structures can be applied to the surface of the phosphor to direct the emission to a desired distribution shape or angular limit.

In some implementations, the present disclosure provides a number of dielectric scattering pillars, arranged to form a close-packed aperiodic array, such as a Vogel spiral, where the geometries of the aperiodic spiral produce azimuthally isotropic scattering of luminescence within a restricted angular cone of extraction. The angular cone of extraction is uniquely defined by the aperiodic geometry of the spiral. For example, parameters of the spiral, such as scaling factor, divergence angle (i.e., golden angle), pillars aspect ratio, or the like can be manipulated to provide a desired angular cone of extraction.

Unlike periodic structures, aperiodic structures can generate far-field (Fourier transform) patterns with no preferred azimuthal directions. Therefore, the aperiodic structures of the present disclosure can provide confinement of light emissions to within a desired angular emission cone. It is to be appreciated that the highest density of extracted k-vectors in proximity of the forward direction can be achieved only when considering diffraction from structures that possess annular regions in their Fourier spectrum. This can be deduced from kinematic diffraction theory. However, this condition cannot be met using traditional periodic arrays.

Accordingly, the present disclosure provides aperiodic structures, with rotationally symmetric k-space designed to meet the kinematic scattering condition for directional forward extraction. For example, this type of structure can reduce light emission into far-field emission angles above ±60°. As noted, emission from the light-emitting device occurs in a hemispherical distribution, often well approximated by a Lambertian characteristic (particularly for the optically thick, luminescent, radiation converting (or producing) layer). Structures and devices according to the present disclosure can thus greatly improve the collection efficiency of secondary optics or downstream projection systems versus the efficiency of conventional systems. It is to be appreciated that the collection efficiency is increased without undesirable high angle artifacts that are typical of traditional periodic structures.

Light emission devices that implement the present disclosure can be smaller in size than conventional devices due to the reduced angular collection requirements. Furthermore, a lower collection angle can reduce aberrations, which may result in higher quality imaging or projection of the light source. This can have advantages in a number of applications, such as, for example, forward automotive lighting where high contrast projection is needed on the roadway to minimize glare.

In various implementations, the present disclosure provides that some light emissions (e.g., above the far-field emissions angles) are scattered back into the converting material (e.g., phosphor, or the like). By scattering light, which would otherwise be emitted outside the desired angular emission cone, back into the converting material, the angular restriction will have a low impact on efficiency. For example, losses in a phosphor converted LED can be kept low with overall losses being less than merely truncating the emission to within a desired cone. This can provide a higher extraction efficiency relative to conventional emission extraction methods. Another benefit is that source (emitting surface) etendue is reduced without significantly degrading overall efficiency or efficacy while increasing luminance. As a specific example, for light emission from a phosphor plate with volume scattering, the internal radiation incident on the emitting surface is approximately Lambertian. If the emitting surface furthermore has no structures for angular control, light emission is also Lambertian (because radiance is conserved), implying that emitted light into a ±60° angular cone may be approximately 75% of the total generated light emission. With some embodiments herein, light emission into the same specific angular cone may exceed 85-90%, for example, depending on the effective reflectivity of the pump light source.

In some implementations, the aperiodic structure can be applied to the phosphor converter in a chip-level conversion (CLC) configuration. For example, the phosphor converter can be a flat plate that is bonded to a pump LED emitting surface (e.g., using glue, or other bonding materials). The phosphor then emits directly into air from a flat surface of area equal (or similar) to the pump device emission area. In such embodiments, the aperiodic structure can decrease emission angle while preserving the minimal emission area of the phosphor surface, especially when emission from the edges of the phosphor plate are covered by highly reflective media such as highly loaded $TiO_2$ powder in silicone matrix. Accordingly, luminance (or radiance) may increase with a minimal penalty in total luminous flux or radiant power.

FIG. 1A illustrates an example embodiment of a dielectric scattering pillar while FIG. 1B illustrates an example embodiment of an array formed from a number of dielectric scattering pillars of FIG. 1A. Turning more specifically to FIG. 1A, a dielectric scattering pillar 100, also referred to herein as a "nano-structure" or simply "structure" is shown. The structure 100 is depicted as a cylinder, having a height (h) 101 and a diameter (D) 103. The structure 100 can be formed of the same material as phosphor emitter layer 220 shown in FIG. 2. In some embodiments, the structure 100 can be formed from dense titanium dioxide ($TiO_2$) film/thin layer. Furthermore, in some implementations, the structure 100 need not have a cylinder shape. For example, the structure can be rectangular, cone, or pyramid shaped and have dimensions depending on the refractive index of its material.

An aperiodic array can be formed from a number of the structures 100. For example, FIG. 1B depicts an aperiodic array 120 including a number of structures 100. More specifically, an aperiodic pattern can be formed from a number of pillars 100-1, 100-2, 100-3, 100-4, . . . 100-n (where n is a positive integer). The pillars 100 within the aperiodic array 120 are spaced an average center-to-center distance from each other <r> 105. As used herein, the term "center-to-center" or "center-to-center distance" means the average distance from the center of one pillar 100 to the center of an adjacent pillar 100. The center to center distance is often referenced as <r>. For example, the <r> 105 depicted in FIG. 1B is from the center of a pillar 100 to the center of an adjacent pillar 100. Specifically, <r> 105 in FIG. 1B depicts the average center-to-center distance <r> 105 from the center of pillar 100-3 to the center or pillar 100-4. More specifically, when referencing <r> herein, the average between the center-to-center spacings of all pillars is meant. It is noted, that the spacing between selected ones of the pillars 100 (e.g., between pillars 100-1 and 100-2) may not be the same as the spacing between other selected ones of the pillars (e.g., between 100-2 and an adjacent pillar besides 100-1).

The aperiodic array 100 can be engineered to have a closed-packed geometry, which produces azimuthally isotropic scattering of luminescence within a restricted angular cone of extraction. The restricted angular cone of extraction is defined uniquely by the aperiodic geometry of the array. Accordingly, modification of various parameters associated with the aperiodic geometry of the array 120 will affect the restricted angular cone. For example, modifying any one or a combination of the scaling factor, the divergence angle (which can approach the golden angle), or the aspect ratio of the structures 100, the pillar height (h) 101, the pillar diameter (D) 103, or the average spacing <r> 105 can affect the restricted angular cone.

Figure 2:
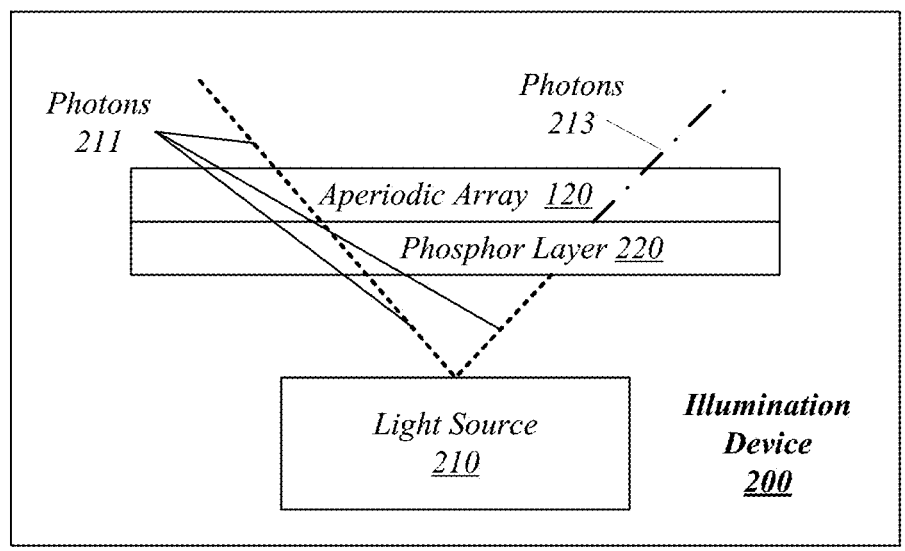
FIG. 2 illustrates a first example illumination device in accordance with various implementations.

FIG. 2 depicts a block diagram of an example illumination device 200 implementing an embodiment of the present disclosure. In general, the illumination device 200 includes a light source 210, a phosphor layer 220, and the aperiodic array 120. In this example, the aperiodic array 120 is located on the phosphor layer 220. During operation, the light source 210 emits a light beam into the phosphor layer 220, where a portion of the light beam is changed to light of a different wavelength. The combination of the originally emitted light and the changed light often results in a spectral light distribution having a wavelength longer than the originally emitted light. For example, the light source 210 can be arranged to emit light (e.g., photons) 211 in either the blue light range or the ultra-violet (UV) light range. Assuming the light source emits blue photons 211, the blue photons 211 can either travel through the phosphor layer 220 unchanged or they may be converted into photons 213 for example in the yellow light range. The combination of the blue photons 211 and yellow photons 213 can combine to generate a white light emitted by the device 200. It is noted that the present disclosure could be implemented with full conversion type devices, or those where the pump light (e.g., all or nearly all blue photons 211) is completely or substantially absorbed in the conversion layer (e.g., phosphor layer 220). Examples are not limited in these contexts.

The aperiodic array 120 is disposed or formed on the phosphor layer 220 and provides that the photons 211 and 213 emitted from the aperiodic array 120 are restricted to a specific angular cone. Further examples of this are given below. In general, the illumination device 200 can be any illumination device where phosphor is used to change the wavelength of the output light beams. For example, the illumination device could be a phosphor coated light emitting diode (LED), or a laser activated remote phosphor (LARP) device. Examples are not limited in this context.

With some implementations, the phosphor layer 220 can include a range of luminescent materials. For example, in the field of solid-state lighting, the phosphor layer 220 may include a polymer (e.g., silicone) matrix with embedded grains of powder phosphors, phosphor grains in a glass matrix (P-i-G), monolithic ceramic phosphors, monolithic single crystal phosphors, various coatings and thin film phosphors including those from physical vapor deposition (PVD, e.g., pulsed-laser deposition, PLD) and chemical vapor deposition (CVD) onto transparent substrates, and other phosphor configurations.

It is noted, high luminance and/or high-power applications may benefit from reduced etendue emissions. Such applications typically require special phosphor conversion materials to enhance heat removal and to reduce thermal quenching of the phosphor. In such cases, the phosphor platelet is typically a bulk/monolithic polycrystalline ceramic phosphor (e.g., cerium-activated garnet phosphor represented by the formula $A_3B_5O_{12}$:Ce, wherein A is Y, Sc, La, Gd, Lu, or Tb and B is Al, Ga or Sc). As a specific example, the phosphor layer 220 can be at least one of $Y_3Al_5O_{12}$:Ce, $(Y,Gd)_3Al_5O_{12}$:Ce, $(Lu,Y)_3Al_5O_{12}$:Ce and $Lu_3Al_5O_{12}$:Ce. As another example, the phosphor layer 220 could include ceramic phosphor materials from another oxide, nitride, oxynitride, fluoride, or the like. As a further example, such ceramic phosphors may contain additional phases such as $Al_2O_3$ to change scattering behavior, increase thermal conductivity, or achieve certain adhesion properties to the bonding material.

In some embodiments, the phosphor layer 220 could include other phosphors such as various aforementioned materials doped with other ions including $Eu^{2+}$, $Eu^{3+}$, $Pr^{3+}$, $Dy^{3+}$ or transition metal ions like $Mn^{2+}$, $Mn^{4+}$, $Cr^{3+}$ or the like. The doping ions may depend on the wavelength of the pump (e.g., light source 210). Such phosphor layers 220 can be provided in applications to achieve a wide range of color coordinates or spectral content for the wavelength converter. The phosphor layer 220 can be formed by using a number of techniques, including mixing the phosphor particles with an organic binder, molding the desired shape, and burning out the organic binder followed by a final high-temperature sintering to form a monolithic piece. The phosphor layer 220 may include single crystal ceramics or powder phosphor embedded in various inorganic (e.g., such as a low-temperature glass) or numerous organic matrix materials. For example, some combination of phosphor powder and lower melting point glasses (e.g., P-i-G, or the like) can be used.

With some implementations, the phosphor layer 220 could include a thin film phosphor. Such phosphor layers 220 may allow excitation in the ultra violet (UV) range and emission in the visible range. Additionally, such phosphor layers may incorporate quantum dots (QDs) into a range of various matrix materials, from organic to inorganic. Such a phosphor layer 220 could be made by a variety of methods (e.g., pulsed-laser deposition (PLD), sputtering, ion-beam, chemical vapor deposition (CVD), metal-organic CVD (MOCVD), or the like). These manufacturing methods may facilitate use of conversion materials such as InGaN, ZnO, AlInGaP and a variety of other semiconductor materials that require an epitaxial film.

Figure 3A:
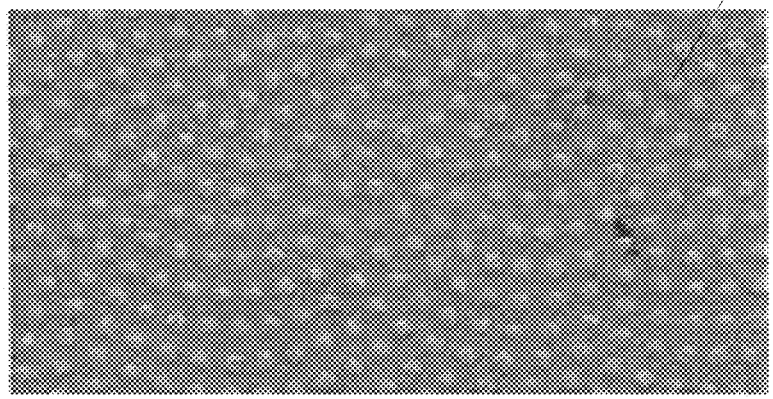
FIGS. 3A, 3B, and 3C illustrate examples of aperiodic arrays modeled on the Vogel spiral in accordance with various implementations.
Figure 3B:
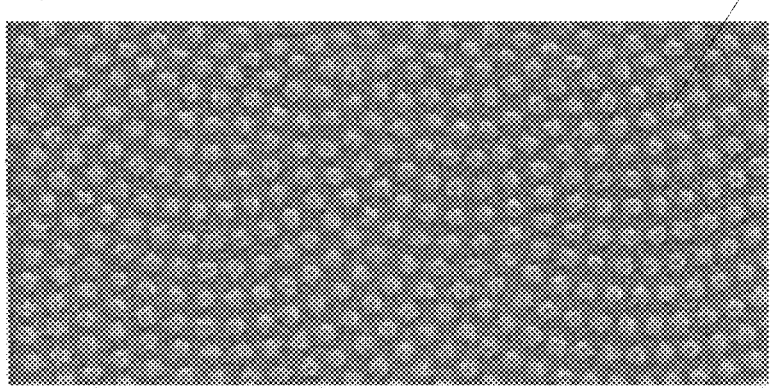
Figure 3C:
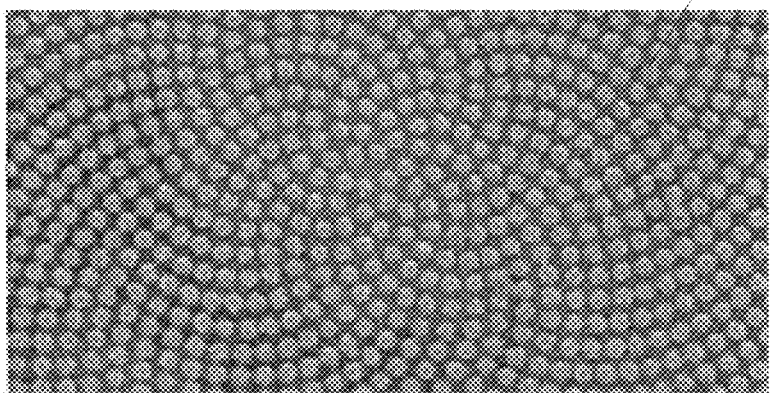

With some examples, the aperiodic array of structures (e.g., the aperiodic array 120 of structures 100) can have a geometry modeled after a Vogel spiral. FIGS. 3A, 3B, and 3C depict examples of aperiodic arrays of structures modeled after the Vogel spiral. It is noted, Vogel spirals are one example of possible engineered aperiodic structures for controlling the directional properties of luminescence. A number of examples of aperiodic structures are presented herein that have a geometry of a Vogel spiral. However, this is not intended to be limiting. In the case of a Vogel spiral, which is a subset of possible aperiodic structures for controlling the directional properties of luminescence from a thick phosphor, the aperiodic array (e.g., the array 120) is formed from a number of pillars (e.g., pillars 100) placed at coordinates:

$$(r_n, \theta_n) = (a\sqrt{n}, n\alpha) \tag{1}$$

Where n is a positive integer representing the pillar number and while a and α are constants.

In some examples, the golden angle (GA) Vogel spiral can be used. The GA Vogel spiral has a deterministic nature while having isotropic filling of k-space within a desired annular region. An example aperiodic array based on the GA Vogel spiral can be formed where α=137.508° and the mean pillar (or array element) separation is <r>=1.7a. Turning to FIG. 3A, an aperiodic array 321 is depicted having pillars 301 where the mean center-to-center spacing <r> between pillars 301 is $r_{mean}$=450 nanometers (nm) and the diameter (D) of the pillar 301 is 226 nm. Turning to FIG. 3B, an aperiodic array 322 is depicted having pillars 302 where the mean center-to-center spacing (r) between pillars 302 is $r_{mean}$=380 nm and the diameter (D) of the pillar 302 is 250 nm. Turning to FIG. 3C, an aperiodic array 323 is depicted having pillars 303 where the mean center-to-center spacing (r) between pillars 303 is $r_{mean}$=320 nm and the diameter (D) of the pillar 303 is 173 nm.

It is noted, the impact an aperiodic array of structures (such as those depicted in FIG. 1B, FIG. 3A, FIG. 3B, and FIG. 3C) has on the angular cone of light emissions is influenced by the diffraction from the aperiodic array pattern, the effective directional or antenna properties of individual pillar in the aperiodic array, and the properties of the luminescent radiation within the phosphor plate that is incident on the array. Accordingly, the present disclosure provides a discussion of such characteristics. As a starting point, assume each pillar to be independent from one another and neglect interactions between pillars. Said differently, consider the aperiodic array as a phase-amplitude mask for the incident light with a more general description of the radiation scattering properties of the pillars. With this assumption, a theoretical description of the operation of the aperiodic array is given. This theory can be extended to approximate aperiodic arrays where the pillars interact with each other. For example, assume the scattering of the net incident field (e.g. electric field component of radiation) by a particular pillar to be from the superposition of the true incident field and the perturbing field generated by scattering from neighboring pillars.

Using partial radiation coherence theory, assume that the wavefront of light just behind the aperiodic array within the phosphor is a wide-sense stationary random wavefront (i.e., the 2$^{nd}$ order statistics do not vary with position but are still spatially correlated). Given this, the following formula for the scattered far-field radiant intensity/($u_0$) (W/sr) from the array can be derived. The radiant intensity is the power per unit steradian emitted into air (or another output medium). In the case of identical pillars, the radiant intensity is:

$$\frac{dP_{SC}}{d\Omega_0} = I(u_0) \approx \int_{|u|<k} \frac{du}{k^2} S(u-u_0) P(u_0, u) L_S(u) \quad (2)$$

Note that Equation (2) assumes that the pillars are strongly scattering and spaced closely enough together such that specular transmission is small. This is essentially equivalent to the result that one would obtain with kinematic diffraction theory. Referring to FIG. 2, we have wavenumbers $k_0$=2π $n_0/\lambda_0$ and k=2π $n/\lambda_0$, where $\lambda_0$ is the free-space wavelength, and n is the refractive index of the phosphor. The variables u and $u_0$ are the transverse components of the wave vectors k and $k_0$, which are given by u=($u_x$, $u_y$)=k($m_x$, $m_y$), and where the direction cosines are given by:

$$m_x = \frac{u_x}{k} = \sin\theta\cos\phi \quad (3)$$
$$m_y = \frac{u_y}{k} = \sin\theta\cos\phi$$
$$m_z = \frac{\sqrt{k^2 - u_y^2}}{k} = \cos\theta$$

The analogous expressions hold for the direction cosines in the output medium with refractive index $n_0$. Note that radiance $L_S$ is the net radiance incident on the aperiodic array from the phosphor side. This net radiance can be the radiance that results from multiple reflections/scattering from both the aperiodic array and light source (e.g., LED, laser, or the like). In the case of Lambertian, Ls would be a directionally constant radiance.

Based on scattering theory (i.e., single scatterer approximation), the scattering function P($u_0$, u) is related to the single pillar scattering amplitude 2×2 tensor $\underline{a}(u_0, u)$ by the following relation:

$$P(u_0, u) \equiv \frac{1}{m_z(u)} \frac{d\sigma_{SC}}{d\Omega_0} = \frac{n_0}{n} \frac{1}{m_z(u) k_0^2} \frac{1}{2} \sum_{q_0 q} |\hat{\varepsilon}_{q_0}(u_0) \cdot \underline{a}(u_0, u) \cdot \hat{\varepsilon}_q(u_0)|^2 \quad (4)$$

Here, the factor P is closely related to the differential cross-section for the pillar, $d\sigma_{SC}/d\Omega_0$ while $\hat{\varepsilon}_q(u)$ and $\hat{\varepsilon}_{q_0}(u_0)$ refer to the incident and scattered polarization vectors in directions defined by u (or $u_0$) with polarization q=s or p.

Figure 4:
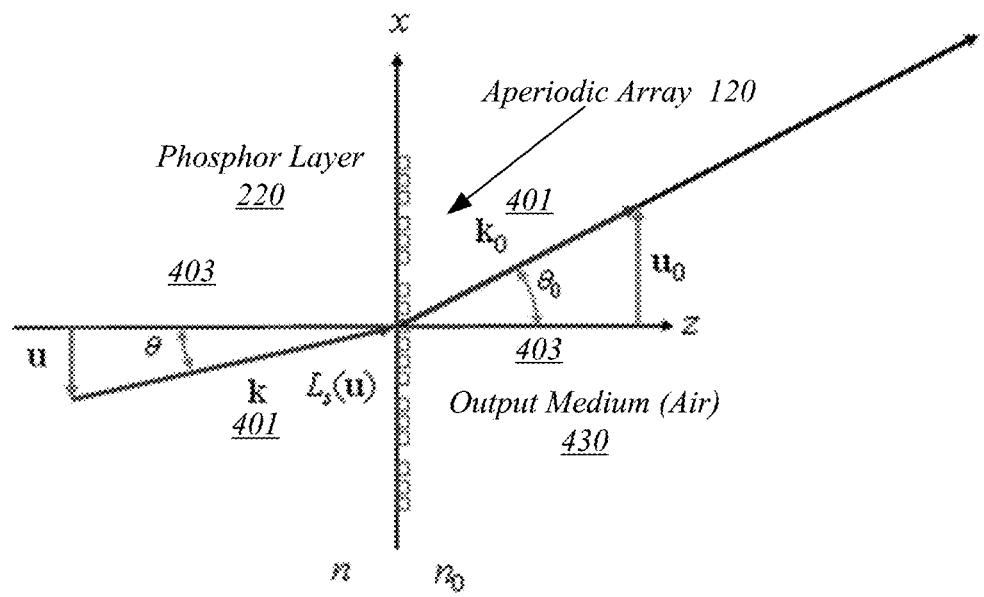
FIG. 4 illustrates a first diagram in accordance with various implementations.

FIG. 4 illustrates a diagram 400 showing definitions of transverse wavevectors and propagation angles for incident radiance distribution $L_S(u)$. This figure depicts wavevectors (k) 401 propagating through a phosphor layer 220 as well as an aperiodic array 120. As depicted, during propagation the aperiodic array 120 changes the angle (θ) 403 of propagation of the wavevectors 401 as they enter the output medium 430 (e.g., air), which is represented by the overall radiance distribution $L_S(u)$.

The structure function S describes the Fourier power spectrum of the diffracted light from the aperiodic array of pillars, represented as:

$$S(u-u_0) = |F(u-u_0)|^2 = |F(u_0-u)|^2 = |\Sigma_j e^{-j(u_0-u)\cdot s_j}|^2, \quad (5)$$

where the vector $s_j$ denotes the locations of the pillars on the converter surface. Referring to Equation (2), it is noted that the spectral power density S is integrated over all propagating transverse wavevectors u within the converting medium (e.g., phosphor layer 220, or the like). Typically, the refractive index of the converting medium is greater than that of the emitting medium, which is typically air. As such, the available transverse wavevectors u<k spans a larger space than available wavevectors $u_0$<$k_0$ in the output medium. Assuming a high scattering limit for the converted illumination device (e.g., illumination device 200, or the like), the incident radiance Ls can be considered a constant. It is noted, that this is useful given the Lambertian radiance approximation is often a limiting approximation for LARP or LED sources. Evaluating the scattering function for a pillar of height h and diameter D in a version of the anomalous diffraction approximation yields the following result:

$$P(u_0, u) = \frac{n_0}{n} \frac{\xi(u_0, u)}{m_z(u)} \frac{(Du_{0z}/2)^2}{|u-u_0|^2} |1 - e^{j(n_p-1)k_0 h}|^2 \left[J_1\left(\frac{|u-u_0|D}{2}\right)\right] \quad (6)$$

where $n_p$ is the refractive index of the pillar (e.g., pillar 100, or the like), $J_1(x)$ is the first order Bessel function, and $\xi(u_0, u)$ is a slowly varying angular function that accounts for the incident and scattered polarizations for a randomly polarized incident field. Further neglecting the far-field angular variation of the pillar scattering, P and L can both be treated as constants in Equation (2).

Figure 5:
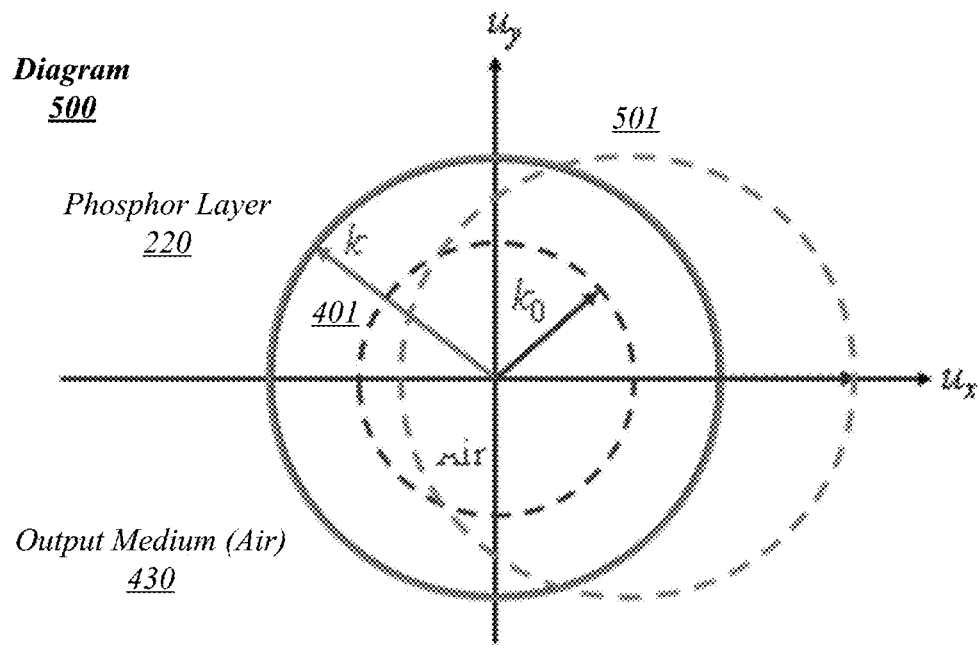
FIG. 5 illustrates a second diagram in accordance with various implementations.

FIG. 5 depicts a diagram 500 illustrating an optimal structure function S 501 for producing emission in a forward direction component even with fully Lambertian light incident on the aperiodic array 120 from within the phosphor layer 220. As illustrated, making the spectrum of S 501 a simple ring with radius equal to k 401, the integral in Equation 1 is largest for emissions in direction normal to the surface ($u_0=0$), and decreases as $u_0 \to k$ since the overlap of the structure function S with the domain of propagating waves in the phosphor layer 220 decreases. Thus, the structure function S can have the form of the following equation.

$$S=\delta(|u|-k) \tag{7}$$

The above detailed theory can be applied to engineer an aperiodic array 120 that will restrict emissions radiated from layer 220 within a desired cone. FIGS. 6A-6D and 7 illustrate the combined role of both the far-field scattering pattern from the array elements P and array pattern as given by the structure factor S has on the resultant restricted emission cone.

Figure 6A:
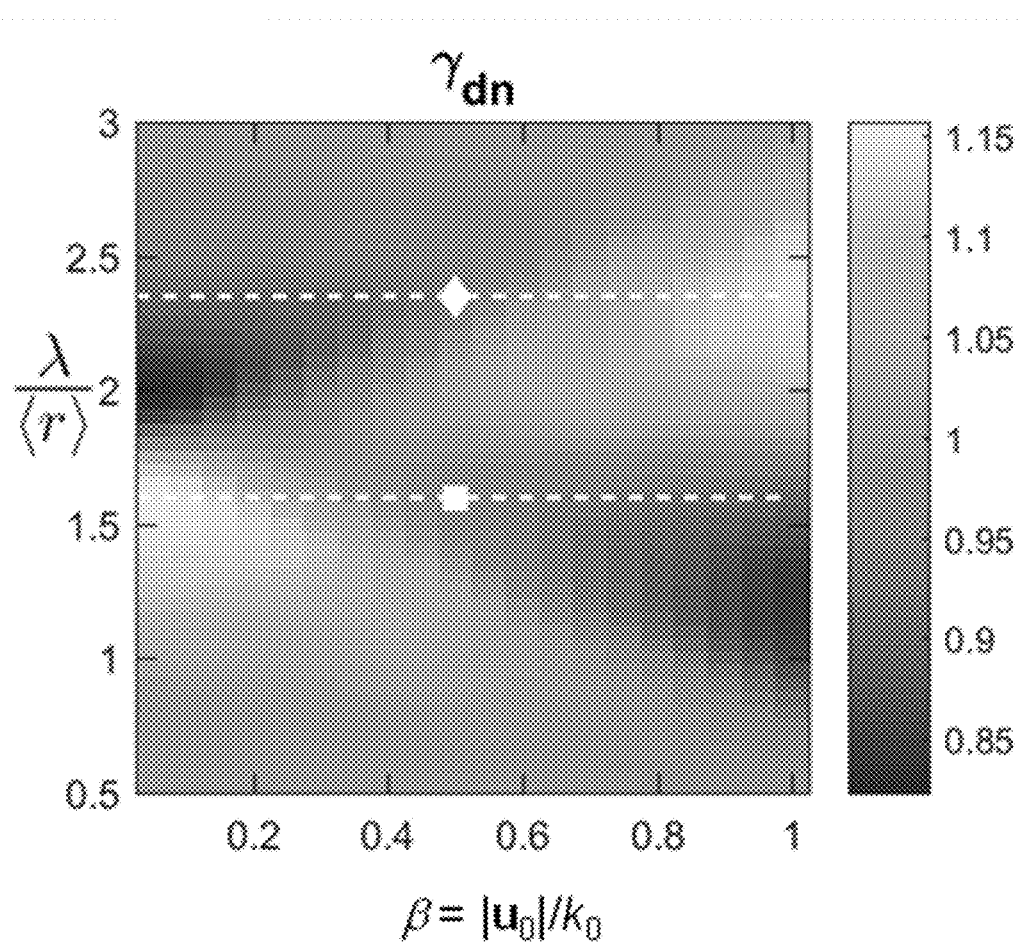
FIGS. 6A, 6B, 6C, and 6D illustrate example graphs in accordance with various implementations.

FIG. 6A illustrates a graph 601 of a parameter space for a normalized radiance profile $\gamma_{dn}$ as a function of outgoing emission with direction from normal $\beta'=|u_0|/k_0$. It is noted that values above one (1) indicate enhanced directional emission in the output direction. Said differently, graph 601 of the parameter space illustrates the results of Equation (2) for a GA Vogel spiral with Lambertian incident radiation. As depicted, for the free-space wavelength $\lambda > 1.8$ an angular ring structure will form in the far-field; for $\lambda < 1.8$, the desired enhancement occurs closer to the normal incidence.

Figure 6B:
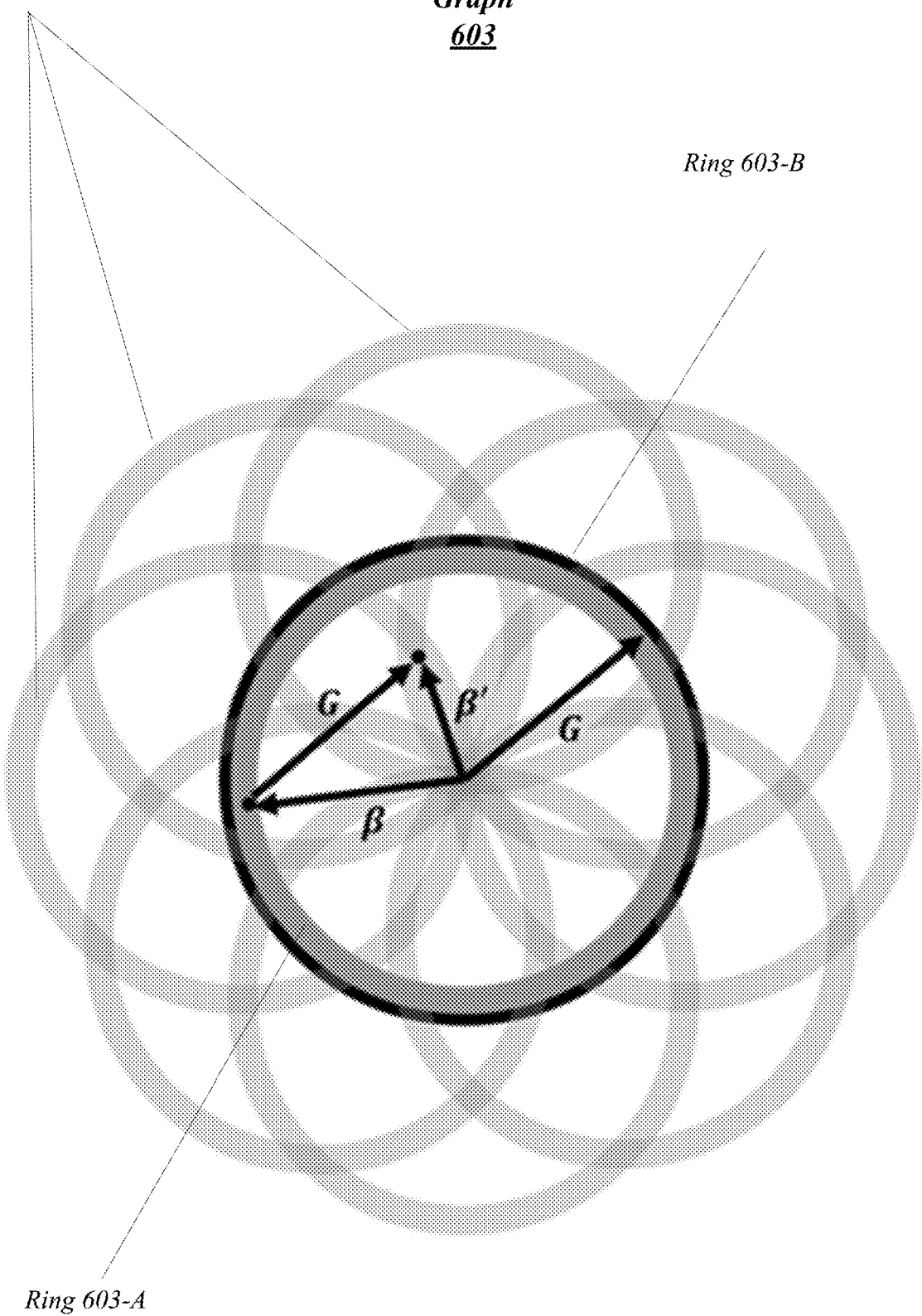

FIG. 6B illustrates a graph 603, depicting a representation of why Equation (7) yields the highest potential forward directionality as discussed herein. More specifically, graph 603 illustrates the principle of light scattering from an isotropic k-space structure to enhance directional emission. Ring 603-A is a set of wave vectors propagating in the high index medium (e.g., the phosphor layer 220, or the like) while ring 603-B represents the dominant feature of S(G). Each rings 603-C represents the set of input vectors scattered by a single array momentum vector G. It is noted, that rings 603-C strongly overlap near the center but minimally overlap near the edges, which leads to enhanced forward emission. The vectors indicate how a single incident wave vector $\beta$ phase matches with a moment vector G to produce a scattered vector $\beta'$ which is nearer to the center of the light cone.

Figure 6C:
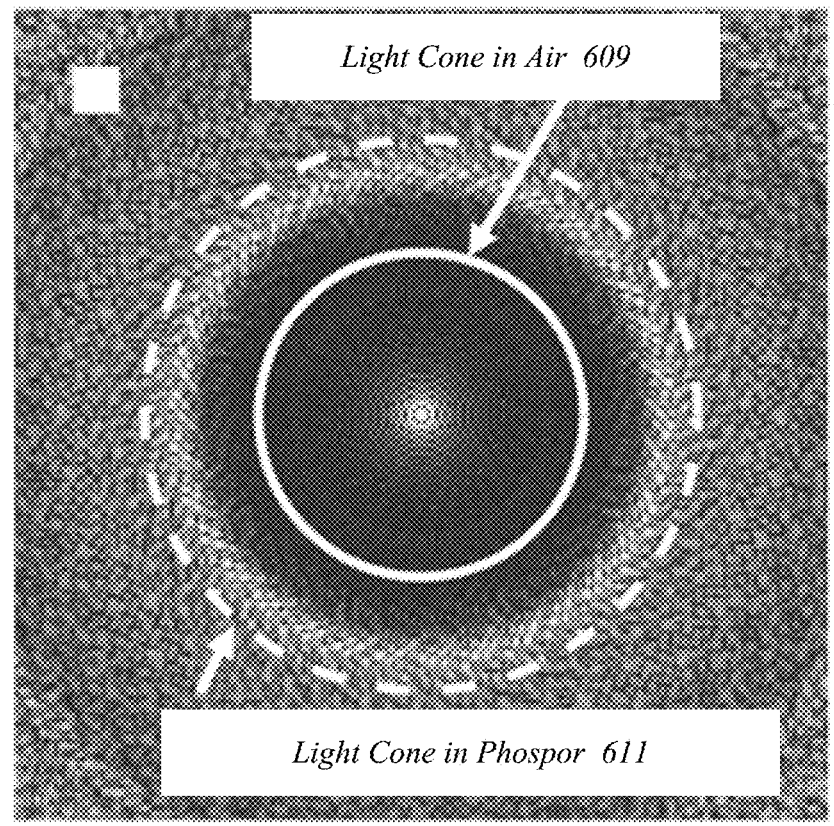
Figure 6D:
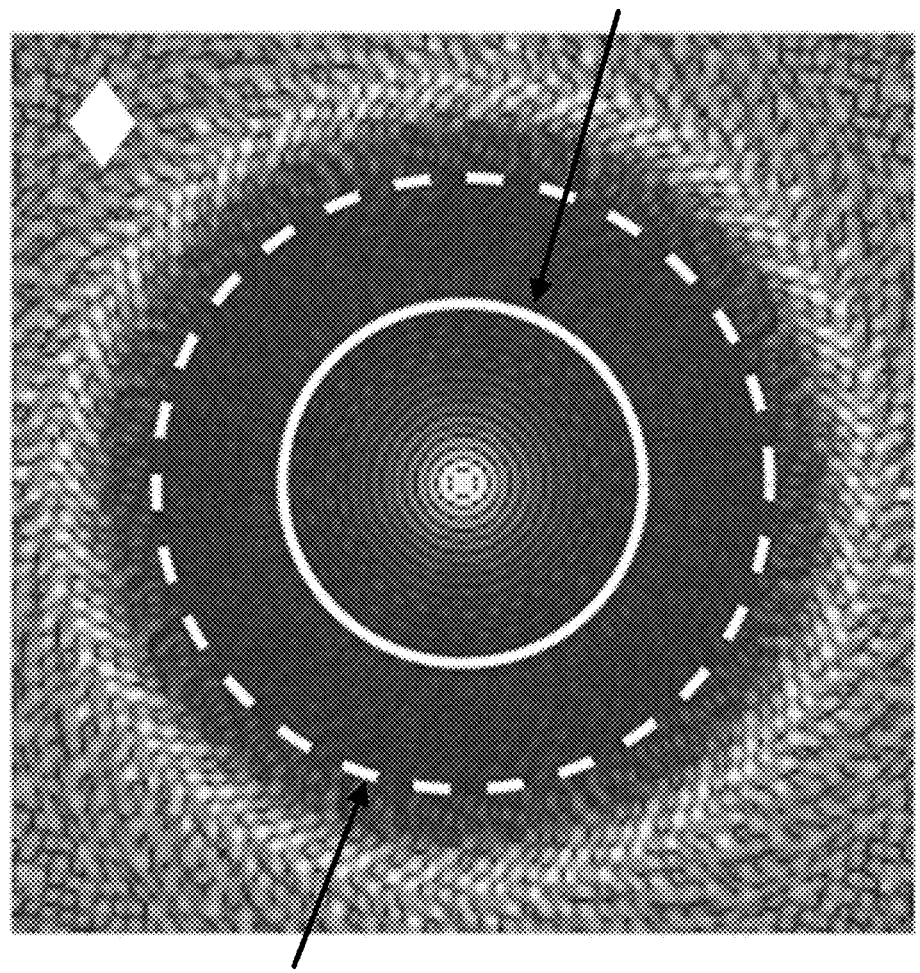

FIGS. 6C and 6D illustrate graphs 605 and 607, respectively. Graphs 605 and 607 each depict the structure function S(G) for the extreme cases of enhanced forward scattering and high angle scatter, respectively. That is, these two figures depict the combined structure function and single element scattering function at u=0, $S(u_0)P(u_0, 0)$ and depict the ring structure of the far-field diffraction pattern of an aperiodic array (e.g., the aperiodic array 120) formed after the GA Vogel spiral. The solid white circle 609 indicates the boundary of the free space light cone while the dashed while circle 611 indicates boundary of the high-index light cone with n=1.82.

Figure 7:
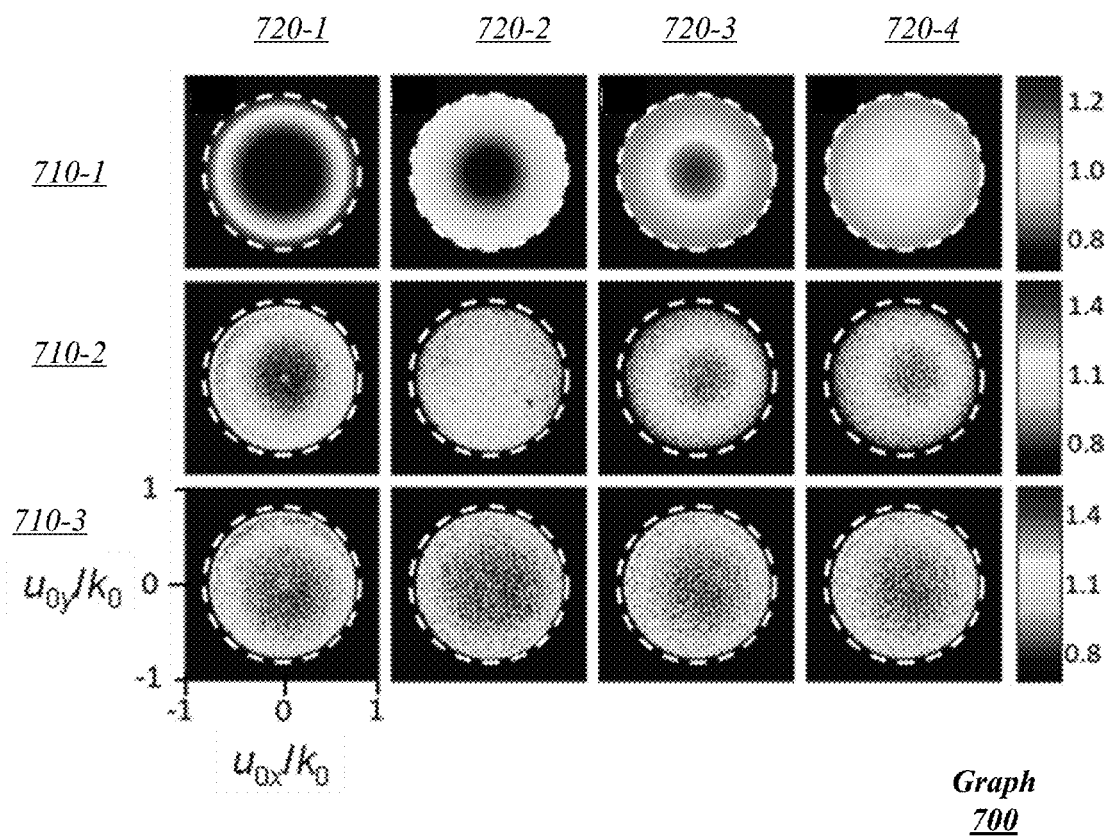
FIG. 7 illustrate another example graph in accordance with various implementations.

FIG. 7 illustrates a graph 700 depicting a number of the Fourier space images representing intensity profiles for a number of different emissions. Graph 700 is organized into rows 710 and columns 720. The first row 710-1 represents the described model, the second row 710-2 represents measurements made on a patterned region of a sample, and the third row 710-3 represents measurements made on an unpatterned region of the same sample. Columns 720 correspond to different patterns of aperiodic arrays having a pillar diameter of 410 nanometers (nm) and a height of 330 nm. Specifically, column 720-1 represents an aperiodic array with a mean nearest neighbor separation of 220 nm, column 720-2 represents an aperiodic array with a mean nearest neighbor separation of 300 nm, column 720-3 represents an aperiodic array with a mean nearest neighbor separation of 380 nm, and column 720-4 represents an aperiodic array with a mean nearest neighbor separation of 450 nm. The graph was generated from free-standing ceramic phosphor plates under laser excitation at 405 nm.

Each of the intensity profiles referenced in this figure (e.g., intensity profile at [710-1, 720-1], etc.) has a white circle with a radius of 0.8, equal to the numerical aperture (NA) of the microscope objective used for making the Fourier space images. It is noted that the role of the radiance distribution (light incident on the array of structures) $L_S$ is quite complex. In practical devices, the need for high light extraction without an increase in etendue usually requires that the illumination element (e.g., LED, laser, etc.) or the entire structure itself has some degree of volume and/or surface scattering.

Typical illumination devices optimized for light extraction of the converted radiation (e.g., phosphor converting devices as discussed herein) provide a final radiance distribution incident on the aperiodic array disposed on the phosphor that is close to Lambertian, as used in the example calculations discussed with reference to Equations (1) to (7). The radiation may also have some degree of intensity enhancement due to cavity effects that ultimately lead to higher extraction efficiencies. For example, in the case of a LARP device, higher degrees of volume scattering are often necessary for good spot confinement (high luminance). Note, although the present disclosure provides examples of light extraction for illumination devices where the incident light distribution is close to Lambertian, this is not intended to be limiting and devices with aperiodic arrays as discussed herein can be provided for illumination devices where the incident light distribution significantly deviates from Lambertian. Said differently, aperiodic arrays, such as those depicted in FIG. 1B and FIGS. 3A-3C can be engineered for devices where the incident light distribution significantly deviates from Lambertian.

Accordingly, as discussed above, an aperiodic array having a pattern based on GA Vogel spirals can provide emission with controlled angular spread. Referring back to FIG. 1B, various parameters of the pattern of the aperiodic array 120, such as, the height (h) 101 of the pillars 100, the diameter (D) 103 of the pillars 100, and the average spacing between pillars $\langle r \rangle$ 105 can be manipulated to limit emission to within a desired angular cone. In some implementations, these parameters can have the following ranges for luminescence wavelengths in the green to red visible range (i.e., 500-650 nm).

$$100 \text{ nm} < h < 1{,}000 \text{ nm}$$

$$100 \text{ nm} < D < 300 \text{ nm} \tag{8}$$

$$0.25\lambda_0 < \langle r \rangle < 2.5\lambda_0$$

In some implementations, these parameters can have the following ranges for luminescence wavelengths centered near 550-570 nm.

$$300 \text{ nm} < h < 400 \text{ nm}$$

$$250 \text{ nm} < D < 350 \text{ nm} \tag{9}$$

$$380 \text{ nm} < \langle r \rangle < 450 \text{ nm}$$

With some implementations, the height (h) can be constrained according to Equation (6). For example, considering the phase delay accumulated by propagation through the pillar in Equation (6), it follows that maximum scattering occurs when the field generated by the pillar is in-phase with the incident field in air, yielding:

$$(n_P-1)k_0 h = \pi, 3\pi, \ldots \quad (10)$$

or, $$h_{opt} \approx \frac{\lambda_0}{2(n_P-1)}(2l+1), l = 0, 1, \ldots \quad (11)$$

Thus, for the case of $\lambda_0 = 550$ nm and a pillar formed from TiO$_2$, with $n_p = 2.4$, the $\ell = 0$ and $\ell = 1$ optimal height would be h=196 nm and 589 nm, It is noted, the first value is somewhat shorter than the optimal heights listed above (which can be found from FDTD simulation and by experimentation). However, the optimal heights from Equations (10) and (11) are a useful starting point for engineering an aperiodic array 120. In some examples, the design approach can be reversed using the following equation.

$$(n_P-1)k_0 h = 2\pi, 4\pi, \ldots \quad (12)$$

Equation (12) may provide maximal backscattering, which can be useful to design an aperiodic array where a region of wavevectors are rejected by the aperiodic array, reflecting them back into the phosphor layer 220.

Likewise, the optimal pillar diameter can be estimated, for example, from Equation (6). It is noted that the dependence on diameter D comes from a term of the form $x^2 J_1(x)$, $x = |u-u_0|D/2$. In some examples, emissions at normal emission ($\theta_0 = 0$) can be maximized. Taking the optimal structure function condition as u≈k, it follows to maximize $(kD/2)^2 J_1(kD/2)$, which has a maximum when:

$$D \approx \frac{2 \times 2.727}{2\pi n} \lambda_0 \quad (13)$$

corresponding to D=260 nm for a monolithic ceramic phosphor (n=1.83) and $\lambda_0 = 550$ nm. The above examples can be extended to engineer or optimize the pillar height and diameter and thus generate aperiodic patterns for other converter materials, emission wavelengths, or the like. Examples are not limited in this regard.

Figure 8:
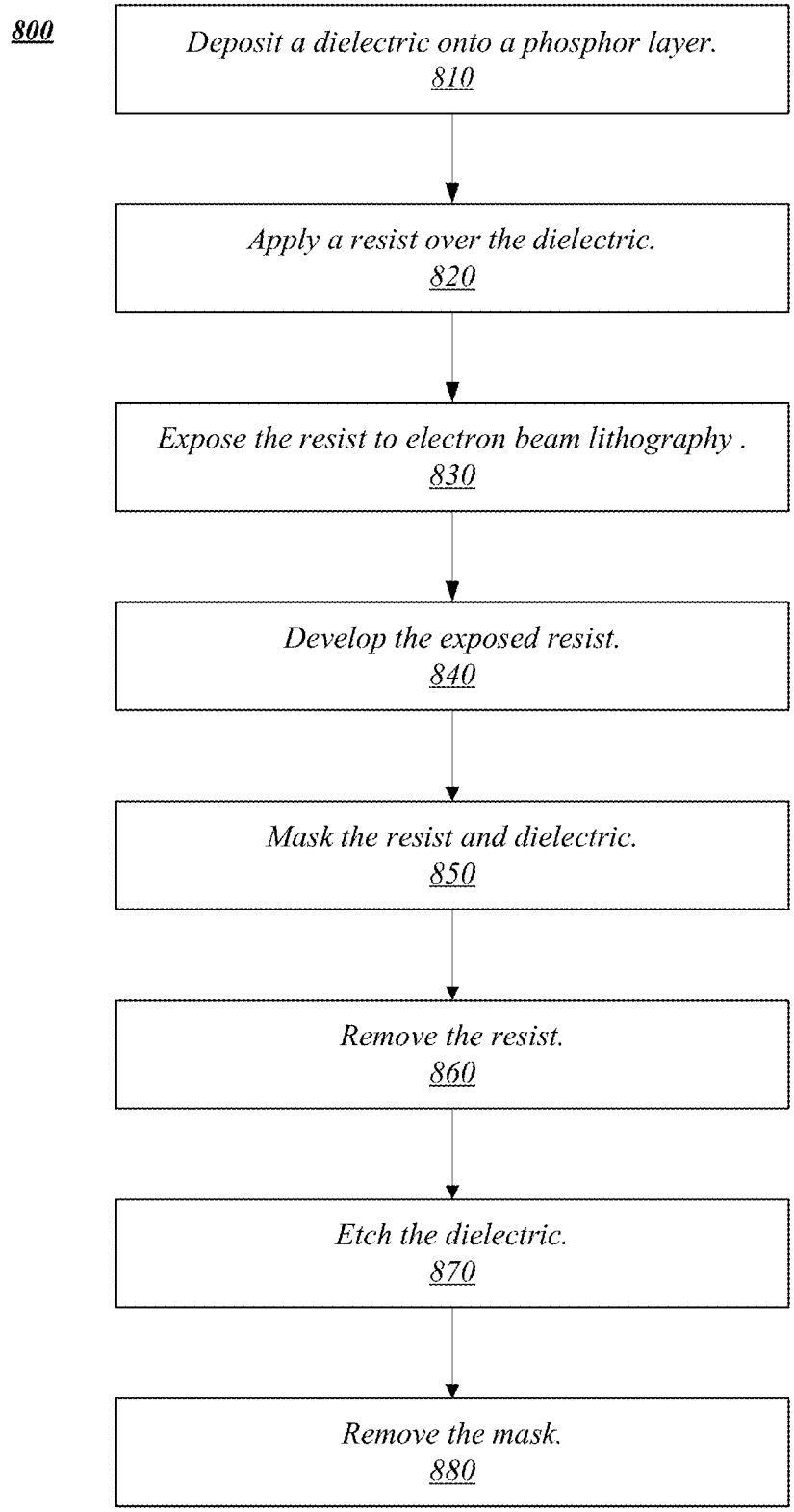
FIG. 8 illustrates a logic flow in accordance with various implementations.

An aperiodic array can be engineered or designed as discussed above and then fabricated. For example, FIG. 8 illustrates a logic flow 800 to fabricate an aperiodic array, according to some examples of the disclosure. FIGS. 9A-9H illustrate an example of an aperiodic array during various stages of manufacture. These figures are discussed in conjunction with logic flow 800 from FIG. 8.

Figure 9A:
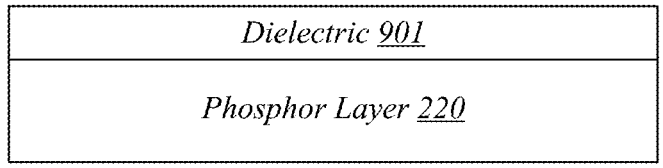
FIGS. 9A, 9B, 9C, 9D, 9E, 9F, 9G, and 9H illustrate an example aperiodic array during various stages of manufacture in accordance with various implementations.

Logic flow 800 can begin at block 810 "deposit a dielectric onto a phosphor layer" where dielectric is deposited onto a phosphor layer. For example, FIG. 9A depicts dielectric 901 deposited onto phosphor layer 220. With some implementations, the dielectric 901 can be titanium oxide (TiO$_2$). For example, TiO$_2$ can be deposited (e.g., via sputtering, or the like) onto a cerium doped yttrium aluminium garnet (Ce:YAG), or like phosphor layers. As a specific example, TiO$_2$ can be deposited by DC sputtering under a base pressure (66.6% Sccm argon+33.3% Sccm O$_2$) of 2.5 m Torr. TiO$_2$ target with a purity of 99.998% and a 3-inch diameter. The target-substrate distance can be fixed at 10 cm. Furthermore, in some examples, periodic motion of 5 rpm of the substrate (e.g., phosphor layer 220) is applied during deposition. As another example, TiO$_2$ can be deposited onto a pre-cleaned Ce:YAG substrate via magnetron sputtering with a DC power of 240 W. In some implementations, the phosphor layer 220 can be cleaned (e.g., prior to deposition) to remove contaminations. For example, the phosphor layer 220 can be cleaned by sonication with acetone and ethanol for a period of time (e.g., 5-15 minutes, or the like). As another example, the phosphor layer 220 can be cleaned via Oxygen etching, such as, at 300 W with a flow rate of 150 Sccm for a period of time (e.g., 2.5 to 10 minutes, or the like).

Figure 9B:
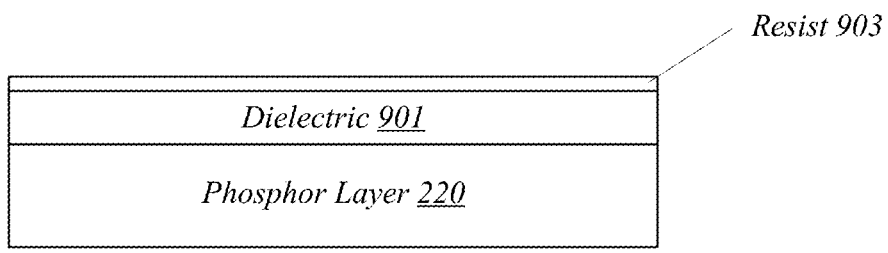
Figure 9C:
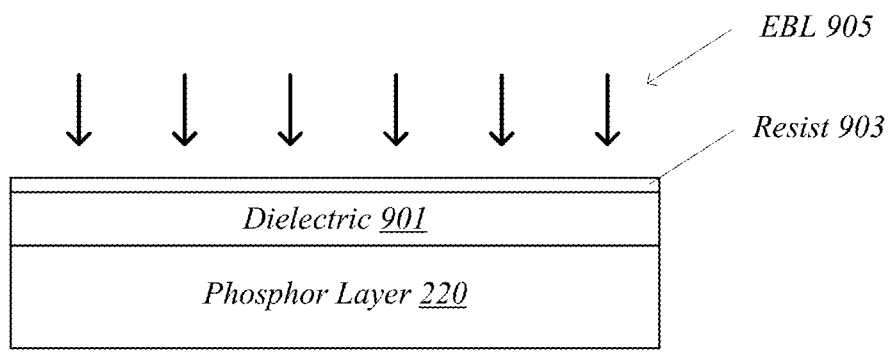
Figure 9D:
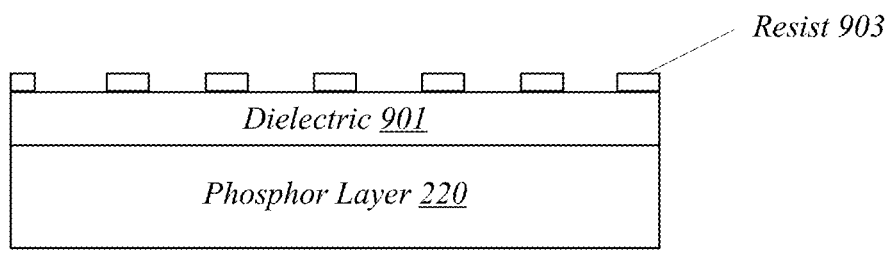

Continuing to block 820 "apply a resist over the dielectric" a resist is coated onto the dielectric. For example, FIG. 9B depicts resist 903 applied over dielectric 901. In some implementations, the resist 903 can be a polymethyl methacrylate (PMMA) polymer-based resist, which can be spin-coated on to the dielectric 901. Continuing to block 830 "expose the resist to electron beam lithography" the resist can be exposed to electron beam lithography (EBL) to modify the solubility of portions of the resist. For example, FIG. 9C depicts resist 903 exposed to EBL 905. As a specific example, resist 903 can be exposed to EBL 905 with a dose of 200 μC/cm2 at a current of 36-37 pA. Continuing to block 840 "develop the exposed resist" the resist layer can be developed, for example, in a solvent to reveal the exposed pattern. For example, FIG. 9D depicts portions of resist 903 dissolved in solvent to reveal a pattern. It is noted, that the portions of the resist 905 exposed to EBL 905 will change solubility to a solvent (e.g., acetone, isopropyl alcohol (IPA), iso-methyl-butyl-ketone (IMBK), or some combination of these) and thus, when developed (e.g., at block 840) will be dissolved while the unexposed portions of resist 903 will not be dissolved, exposing portions of the dielectric 901.

Figure 9E:
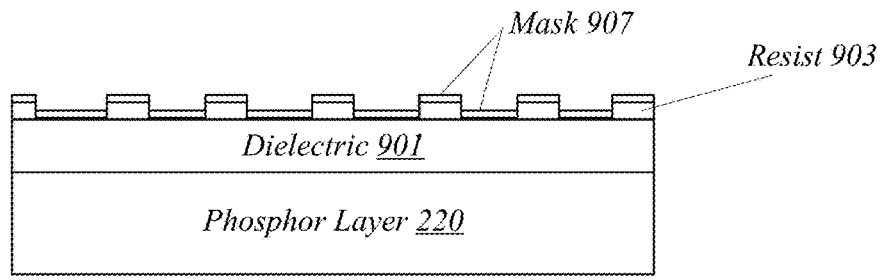
Figure 9F:
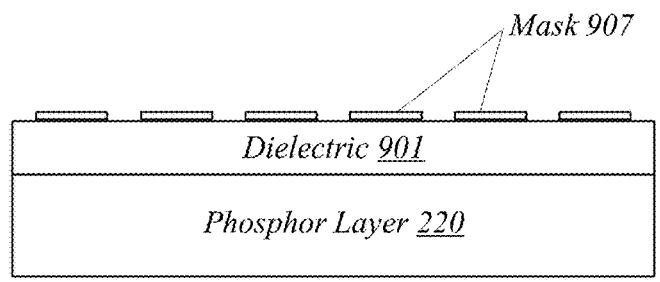
Figure 9G:
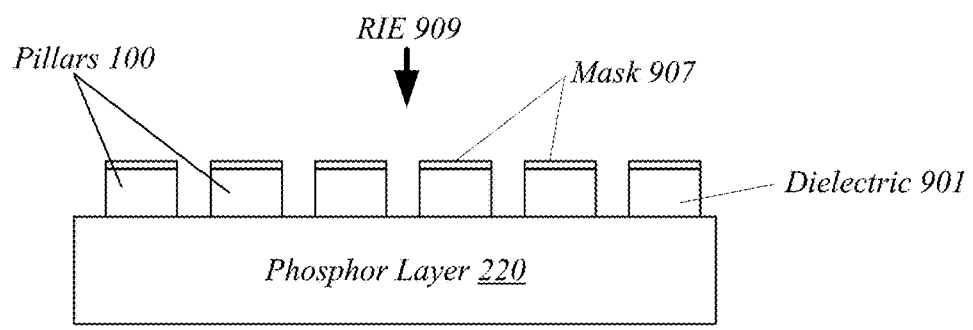

Continuing to block 850 "mask the resist and dielectric" a mask can be applied over the resist and exposed dielectric. For example, FIG. 9E depicts mask 907 applied over the patterned resist 903 and the exposed portions of the dielectric 901. In some implementations, the mask can be composed of chromium (Cr). Continuing to block 860 "remove the resist" the resist can be removed, thereby leaving only portions of the dielectric masked. For example, FIG. 9F depicts the resist 903 removed and only portions of the dielectric 901 masked with mask 907. Continuing to block 870 "etch the dielectric" the dielectric can be etched, for example, via reactive ion etching (RIE) or the like. For example, FIG. 9G depicts the dielectric 901 etched via RIE 909 to form dielectric pillars 100.

Figure 9H:
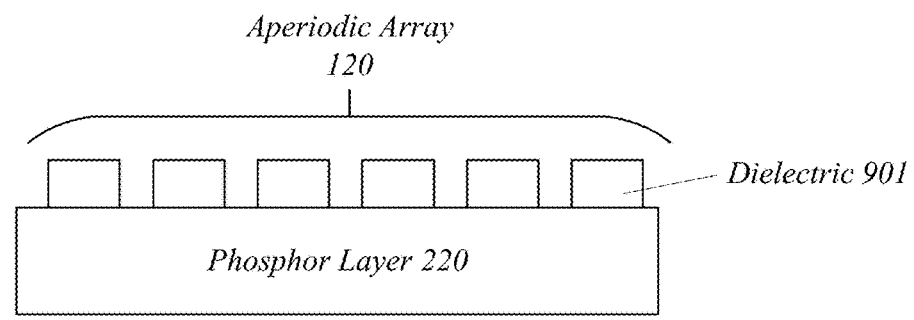

Continuing to block 880 "remove the mask" the mask can be removed from the dielectric to form the completed aperiodic array. For example, FIG. 9H depicts aperiodic array 120 including dielectric pillars 100 formed on phosphor layer 220. It is noted, that an aperiodic array (e.g., aperiodic array 120, or the like) can be formed via the lithography method detailed herein, or via other nanostructure manufacturing techniques, such as, for example, DUV lithography, nanoimprint processes, three-dimensional (3D) printing, or the like. Examples are not limited in this context.

It is noted that with some examples, pillars for an aperiodic array 120 could be formed directly from a converting layer, as opposed to from a dielectric as depicted and discussed in FIG. 8 and FIGS. 9A-9H. For example, referring to method 800, operation 810 could be omitted and a resist could be applied directly to the phosphor layer 220 at operation 820. Manufacturing could continue as discussed, or using other techniques, to form the pillars 100 of the aperiodic array 120 from the phosphor layer 220 directly. Examples are not limited in this context.

Returning to FIG. 2, as depicted, some implementations provide the phosphor layer 220 excited by a light source 210 from the back side while the aperiodic array 120 disposed on the front side of the phosphor layer 220 restricts light emission to within a particular emission cone. The graph 700 of FIG. 7, which depicts Fourier space images is from such an implementation. In particular, the ceramic layer 220 was free-standing ceramic phosphor excited by a laser, from the back side, at 405 nm. In general, the excitation wavelength of the pump source 210 may coincide with the absorbing excitation band of the luminescent material. Referring to FIG. 7, the first row 710-1 approximates theoretical calculations similar to Equation (2) for a Vogel spiral and Lambertian incident radiance (Ls=constant). As luminescence is typically generated by isotropically emitting radiators, the generation of Lambertian incident light requires some volume and/or surface scattering. Experimental measurements of the far-field angular distribution in rows 710-2 and 710-3 were done using k-space measurements scheme. As discussed above, columns 720 correspond to different average pillar spacings. As depicted, as pillar spacing increases, the far-field pattern changes from ring type to a central localized enhancement as the radius of the main ring in the structure function of the aperiodic array 120 (e.g., Vogel spiral, or the like) goes from being above the propagating waves in the phosphor layer 220 to being about equal to k (e.g., refer to Equation (7)). It is noted that both the experimental data (row 710-2) and the approximate theoretical calculations (row 710-1) are in good qualitative agreement.

To verify that the experimental results are not measurement artifacts, row 710-3 shows the same platelets excited by 405 nm light, but off the array. The weak ring structure observed in the periphery is consistent with emission of converted light in low scattering transparent phosphors. As can be seen from FIG. 7, optimal average pillar spacing for most forward directed light occurs when <r>=380 nm-450 nm.

Figures 10A, 10B, 10C:
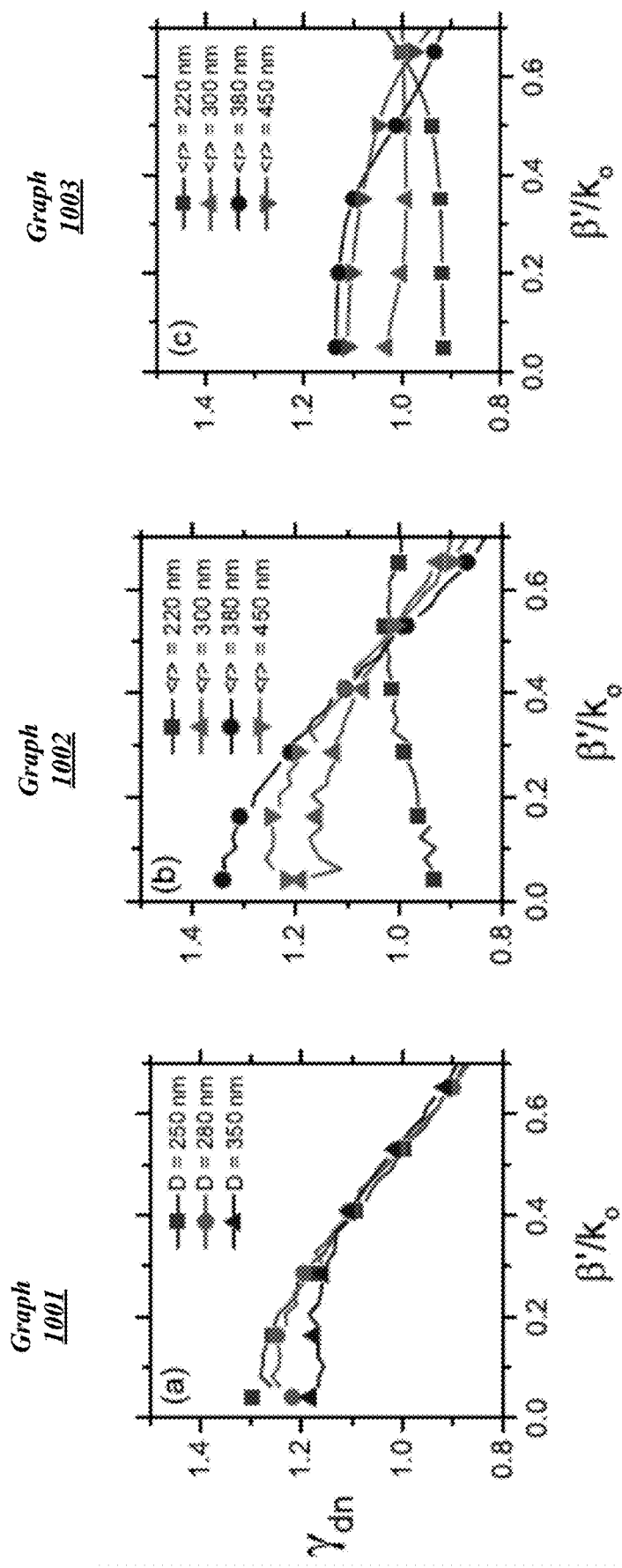
FIGS. 10A, 10B, and 10C illustrate graphs of various experimental variations in parameters of an aperiodic array in accordance with various implementations.

FIGS. 10A, 10B, and 10C illustrates graphs showing various experimental variations in parameters of an aperiodic array. Note, that each of the graphs plot radiance $\gamma_{dn}$ of outgoing emission as a function of normalized directionality of the emission $\beta'/k_0$. For example, FIG. 10A depicts graph 1001, showing varying diameter (D) 103 of the pillars 100 in the aperiodic array 120 with a fixed mean separation <r>=450 nm. As can be seen, pillar diameter 103 has a minimal effect on directionality with a maximum at 250 nm<D<280 nm. FIG. 10B depicts graph 1002, which illustrates a dependency of radiance on mean pillar separation <r>, with a maximum directionality obtained for <r>=380 nm. Directional enhancement of up to 35% is noted in the forward direction as <r> increased from 220 nm to 450 nm. Note that graphs 1001 and 1002 were obtained from experimental data using a free-standing ceramic LuAG phosphor plate, which may not exhibit full Lambertian incident radiation in the phosphor. FIG. 10C depicts graph 1003, illustrating theoretically modeled directional enhancement, which shows agreement with the experimental graphs 1002 of FIG. 10B.

Figure 11:
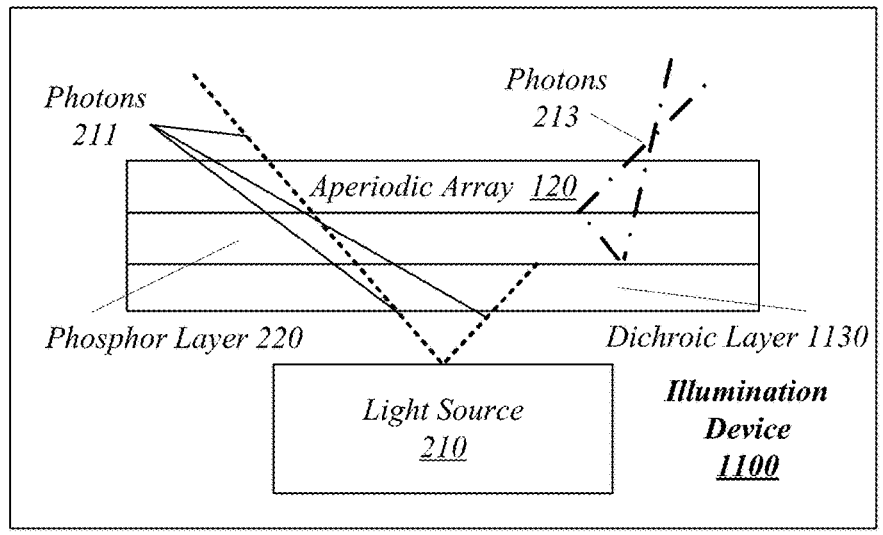
FIG. 11 illustrates a second example illumination device in accordance with various implementations.

FIG. 11 depicts a block diagram of an example illumination device 1100 implementing an embodiment of the present disclosure. In general, the illumination device 1100 includes a light source 210, a phosphor layer 220, the aperiodic array 120, and a dichroic layer 1130. As depicted, the dichroic layer 1130 is disposed on a back side of the phosphor layer 220 while the aperiodic array 120 is disposed on a top or front side of the phosphor layer 220. During operation, the light source 210 emits a light beam (photons 211) into the phosphor layer 220, thereby exciting the phosphor layer 220 and causing emission of photons 213. The dichroic layer 1130 is arranged to pass or transmit light of the wavelength emitted by light source 210 (e.g., blue light, or the like) while reflecting other, longer wavelength light (e.g., yellow light, or the like). The phosphor layer 220 emits photons 213 from both the front and back side of the phosphor layer 220. However, due to the dichroic layer 1130, photons 213 are reflected back into the phosphor layer 220. It is noted, that light emitted by the phosphor layer 220 (e.g., photons 213, or the like) may experience greater scattering and therefore the radiance distribution behind the array (Ls) may generally become close to Lambertian. The loss of directional characteristics in the radiance distribution may reduce directional effects of the final emitted light from the aperiodic array 120 into the output medium (e.g., air, or the like). However, the specific spectral characteristics of the aperiodic array 120 provide more tolerance to the incident radiance distribution than other configurations (e.g., periodic arrays, lenses, etc.).

Figure 12:
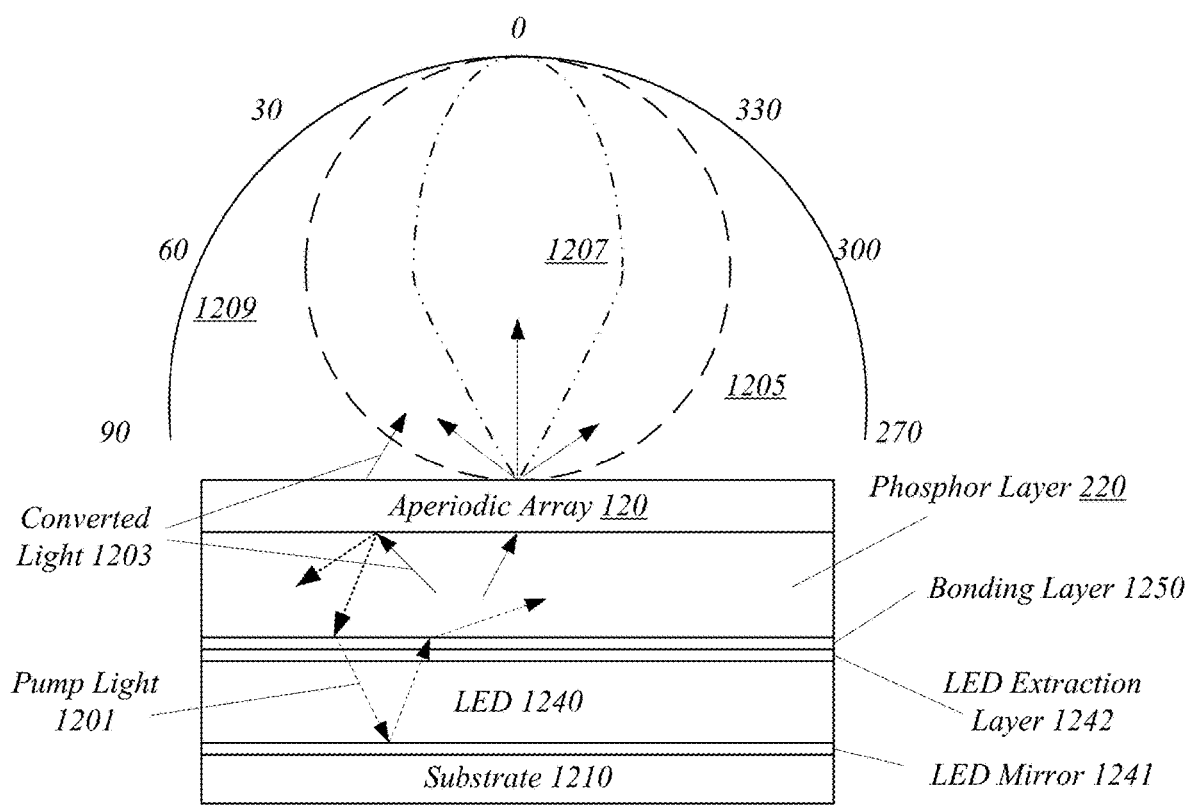
FIG. 12 illustrates a third example illumination device in accordance with various implementations.

FIG. 12 depicts a block diagram of an example illumination device 1200 implementing an embodiment of the present disclosure. In general, the illumination device 1200 includes a forward-emitting LED 1240 formed on substrate 1210 and having LED mirror 1241 disposed on a back surface of the forward-emitting LED 1240 and an LED extraction layer 1242 disposed on a top surface of the forward-emitting LED 1240. A phosphor layer 220 is directly attached to the top surface (e.g., LED extraction layer 1242) of the forward-emitting LED 1240 via a bonding layer 1250 (e.g., adhesive film, or the like). The aperiodic array 120 is disposed on the top surface of the phosphor layer 220. The configuration depicted in this figure may be typically referred to as a chip-level conversion (CLC) device. The LED 1240 can be a blue emitting InGaN LED including the LED mirror 1241 and LED extraction layer 1242 (e.g., highly roughed surface, or the like). The phosphor layer 220 can be a ceramic phosphor (e.g., or P-i-G, or one of the many other phosphor layers discussed herein).

During operation, pump light 1201 from the LED 1240 is partially or fully absorbed in the phosphor layer 220. Converted light 1203 (e.g., luminescence) is emitted isotropically from the activator ions or other emitting centers (such as quantum dots or color centers) in the composition of the phosphor layer 220. Surface scattering and volume scattering within the phosphor change the radiance distribution inside the phosphor and incident on the aperiodic array covered emitting surface. This final radiance distribution inside the phosphor, but incident on the array, determines the net angular emission profile into the output medium (e.g., air, or the like). Volume scattering within the phosphor layer 220 can be produced by pores, phosphor particles or additional material phases, grain boundaries, and other scattering centers (refractive index contrast steps) that can be introduced into the phosphor layer 220.

This figure further depicts a polar plot (dashed line) of a conventional far-field radiant intensity distribution 1205, which is typical from the surface of a phosphor layer with an unstructured surface. Additionally, this figure depicts a plot (dashed-dotted line) of a sample far-field radiant intensity distribution 1207 generated by the aperiodic array 120, which has a narrower profile than the conventional distribution 1205. It is noted, on the bottom side of the phosphor layer 220 (e.g., the LED 1240 side of the phosphor layer 220) surface scattering results from the net effect of the interface between the bonding layer 1250, the LED extraction layer 1242 and the LED mirror 1241. It is noted, that the plots 1205 and 1207 are plotted against polar axis 1209.

In general, the pump light 1201 exiting the phosphor layer 220 will have a different internal radiance distribution than the converted light 1203. In some implementations, the aperiodic array 120 can be configured or arranged to control the angular profile of both converted light 1203 and pump light 1201. Said differently, as the phase response and far-field scattering of the pillars 100 within the aperiodic array 120 are wavelength dependent, an aperiodic array 120 could be engineered to affect both pump light 1201 and converted light 1203.

Figure 13:
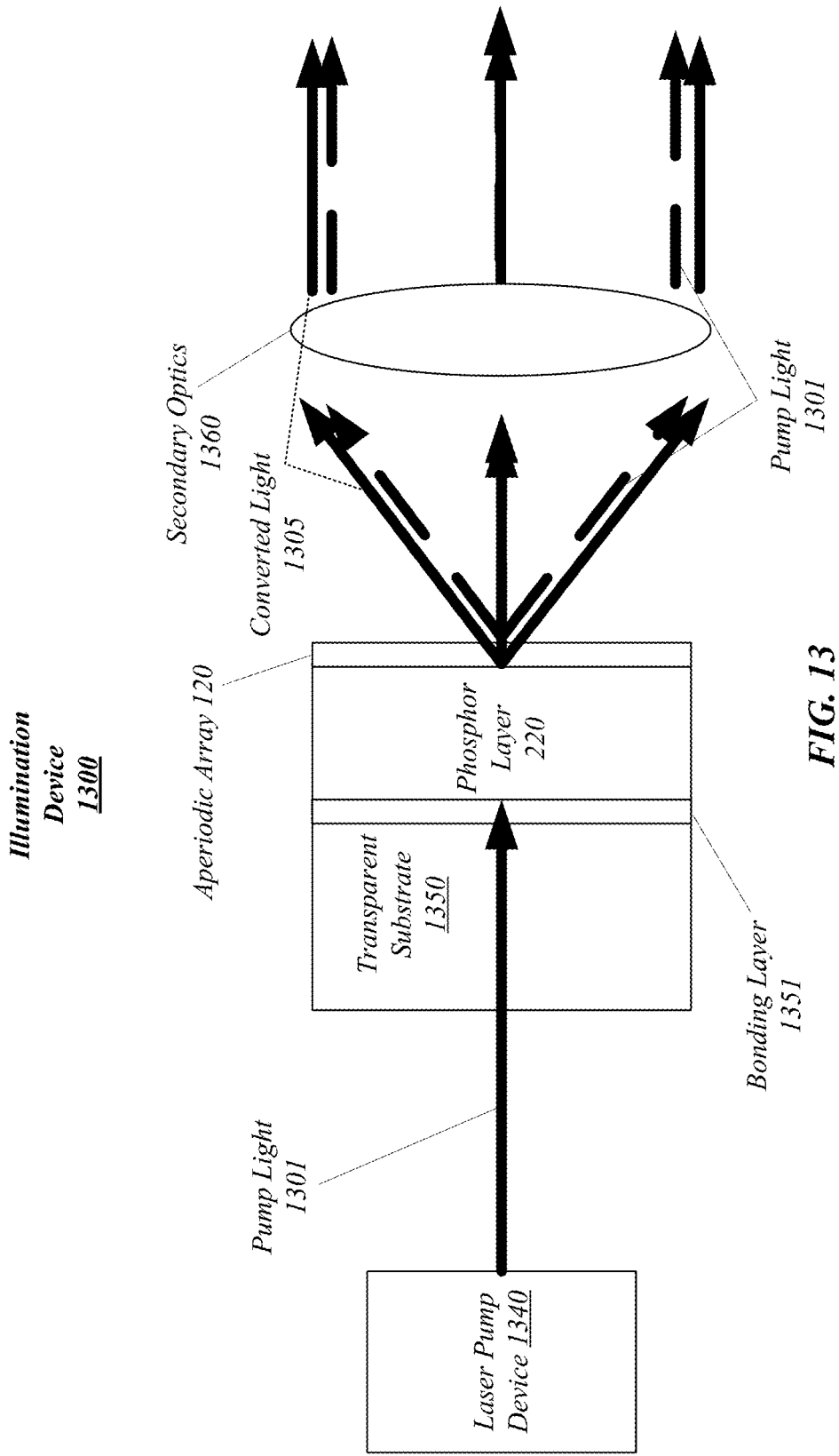
FIG. 13 illustrates a fourth example illumination device in accordance with various implementations.

FIG. 13 depicts a block diagram of an example illumination device 1300 implementing an embodiment of the present disclosure. In general, the illumination device 1300 includes a laser pump device 1340 arranged to emit pump light 1301 directed to a phosphor layer 220 with an aperiodic array 120 disposed on the phosphor layer 220. The phosphor layer 220 is disposed on a transparent substrate 1350 via a bonding layer 1351 (e.g., adhesive, or the like). In some examples, the laser pump device 1340 can be a focused or closely spaced blue diode laser. The illumination device 1300 further includes secondary optics 1360 (e.g., a collimation lens, or the like) disposed downstream from the laser pump device 1340 and the phosphor layer 220. The illumination device 1300 is often referred to as a laser-activated remote phosphor (LARP) device. Such a LARP device can have either reflective geometry (pump light incident on phosphor from the side of aperiodic array, not depicted in this figure) or transmissive geometry (depicted in this figure). The phosphor layer 220 can be a ceramic phosphor (e.g., P-i-G, or one of the many other phosphor layers discussed herein).

During operation, the aperiodic array 120 restricts the angular emission of the far-field pattern such that the secondary optics 1360 can collect more converted light 1303 and pump light 1301 within its numerical aperture compared to that from a surface without an aperiodic array. In general, the pump light 1301 exiting the phosphor layer 220 will have a different internal radiance distribution than the converted light 1303, and therefore may be controlled differently by the aperiodic array 120 to achieve desirable effects. Here, as in FIG. 12, the aperiodic array 120 may be designed to also control the angular emission of the pump light 1301 in addition to the converted light 1303. It is noted, although not depicted in this figure, illumination device 1300 could optionally include a dichroic layer. For example, the dichroic layer could be disposed on the phosphor layer 220 or on the transparent substrate 1350.

Various aspects disclosed herein include an illumination device having a light source to emit a first light beam having a wavelength within a first range of wavelengths, a converting material arranged such that the light beam is incident on the converting material, the converting material to emit a second light beam having a wavelength within a second range of wavelengths, the second range of wavelengths different from the first range of wavelengths, and an aperiodic array disposed on the converting material, the aperiodic array including a plurality of pillars arranged to form an aperiodic pattern, the aperiodic array to restrict emission of the second light beam to within a restricted angular cone.

In some implementations, the aperiodic array includes circularly symmetric Fourier k-space to produce azimuthally isotropic scattering of luminescence within the restricted angular cone. In some implementations, the plurality of pillars forms a Vogel spiral. In some implementations, the plurality of pillars forms a golden angle Vogel spiral. In some implementations, the converting material includes phosphor. In some implementations, the converting material has the composition A3B5O12:Ce, wherein A is selected from the group consisting of Y, Sc, La, Gd, Lu, or Tb and B is selected from the group consisting of Al, Ga or Sc. In some implementations, the second wavelength range is between 500 nanometers and 600 nanometers. In some implementations, the light source is a light emitting diode (LED). In some implementations, the first wavelength range is between 430 nanometers and 495 nanometers or between 375 nanometers and 410 nanometers. In some implementations, the converting material is disposed on a top surface of the LED. In some implementations, the light source is a laser. In some implementations, the illumination device further includes collection optics arranged downstream from the converting material. In some implementations, a mean center-to-center spacing between each of the plurality of pillars is between 300 and 500 nanometers. In some implementations, each of the plurality of pillars has a height of between 100 nanometers and 1,000 nanometers. In some implementations, each of the plurality of pillars is cylindrically shaped and has a diameter of between 100 nanometers and 300 nanometers.

Other aspects described herein include an aperiodic array to restrict illumination emissions to within an angular cone, the aperiodic array including a substrate, and a plurality of dielectric pillars disposed on the substrate and arranged to form an aperiodic array, the plurality of dielectric pillars to cooperate to produce azimuthally isotropic scattering of incident luminescence to within a restricted angular cone.

In some implementations, each of the plurality of dielectric pillars includes a transparent dielectric. In some implementations, each of the plurality of dielectric pillars includes titanium dioxide (TiO2), titanium nitride (TiN), silicon (Si), silicon nitride (SiN), or doped oxides. In some implementations, the aperiodic array is a Vogel spiral. In some implementations, a mean center-to-center spacing between each of the plurality of pillars is between 0.25 and 2.5 times the wavelength of the incident luminescence. In some implementations, each of the plurality of pillars is cylinder shaped, cone shaped, pyramid shaped, or rectangular shaped. In some implementations, each of the plurality of pillars is cylindrically shaped and has a height of between 100 nanometers and 1,000 nanometers and a diameter of between 100 nanometers and 300 nanometers. In some implementations, the substrate includes phosphor.

Other aspects disclosed herein includes a method of manufacturing an aperiodic array to restrict illumination emissions to within an angular cone, the method including applying a pattern, to mark a plurality of pillars arranged in an aperiodic array, onto a substrate including a wavelength converting material arranged to emit light of a first wavelength responsive to incidence of light of a second, different, wavelength, and forming the plurality of pillars from the substrate.

In some implementations, the method further includes depositing a dielectric material into the wavelength converting material, and etching the dielectric material to form the plurality of pillars. In some implementations, the aperiodic array is a Vogel spiral. In some implementations, each of the plurality of pillars is cylindrically shaped and has a height of between 100 nanometers and 1,000 nanometers and a diameter of between 100 nanometers and 300 nanometers, and a mean center-to-center spacing between each of the plurality of pillars is between 0.25 and 2.5 times the first wavelength.

Some embodiments may be described using the expression "one embodiment" or "an embodiment" along with their derivatives. These terms mean that a feature, structure, or characteristic described in relation to the embodiment is included in at least one embodiment. The appearances of the phrase "in one embodiment" in various places in the specification are not necessarily all referring to the same embodiment. Further, some embodiments may be described using the expression "coupled" and "connected" along with their derivatives. These terms are not necessarily intended as synonyms for each other. For example, some embodiments may be described using the terms "connected" and/or "coupled" to indicate that two or more elements are in direct physical or electrical contact with each other. The term "coupled," however, may also mean that two or more elements are not in direct contact with each other, yet still co-operate or interact with each other. Furthermore, aspects or elements from different embodiments may be combined.

It is emphasized that the Abstract of the Disclosure is provided to allow a reader to quickly ascertain the nature of the technical disclosure. It is submitted with the understanding that it will not be used to interpret or limit the scope or meaning of the claims. In addition, in the foregoing description, various features are grouped together in a single embodiment to streamline the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the description, with each claim standing on its own as a separate embodiment. In the appended claims, the terms "including" and "in which" are used as the plain-English equivalents of the respective terms "comprising" and "wherein," respectively. Moreover, the terms "first," "second," "third," and so forth, are used merely as labels, and are not intended to impose numerical requirements on their objects.

What is claimed is:

1. An illumination device comprising:
    a light source configured to emit a first light beam having a wavelength within a first range of wavelengths;
    a converting material arranged in a phosphor layer such that the first light beam is incident on the converting material, the converting material configured to emit a second light beam having a wavelength within a second range of wavelengths, and the second range of wavelengths different from the first range of wavelengths; and
    a dielectric aperiodic array disposed on the phosphor layer, the aperiodic array comprising a plurality of sub-wavelength scattering pillars arranged to form an aperiodic pattern, the aperiodic array configured to restrict emission of the second light beam to within a restricted angular cone,
    wherein the aperiodic pattern of the dielectric aperiodic array is configured to produce azimuthally isotropic scattering of incident luminescence within the restricted angular cone,
    wherein the phosphor layer is a flat plate and optically thick, and
    wherein each of the plurality of dielectric pillars comprises a transparent dielectric.

2. The illumination device of claim 1, wherein the aperiodic array comprises circularly symmetric Fourier k-space configured to produce azimuthally isotropic scattering of luminescence within the restricted angular cone.

3. The illumination device of claim 1, wherein the plurality of pillars forms a Vogel spiral.

4. The illumination device of claim 3, wherein the plurality of pillars forms a golden angle Vogel spiral.

5. The illumination device of claim 1, wherein the converting material comprises phosphor.

6. The illumination device of claim 5, wherein the converting material has a composition $A_3B_5O_{12}:Ce$, and wherein A is selected from the group consisting of Y, Sc, La, Gd, Lu, Tb and B is selected from the group consisting of Al, Ga and Sc.

7. The illumination device of claim 5, wherein the second range of wavelengths is between 500 nanometers and 600 nanometers.

8. The illumination device of claim 1, wherein the light source is a light emitting diode (LED).

9. The illumination device of claim 8, wherein the first range of wavelengths is between 430 nanometers and 495 nanometers or between 375 nanometers and 410 nanometers.

10. The illumination device of claim 8, wherein the converting material is disposed on a top surface of the LED.

11. The illumination device of claim 1, wherein the light source is a laser.

12. The illumination device of claim 11, further comprising collection optics arranged downstream from the converting material.

13. The illumination device of claim 1, wherein a mean center-to-center spacing between each of the plurality of pillars is between 300 and 500 nanometers.

14. The illumination device of claim 1, wherein each of the plurality of pillars has a height of between 100 nanometers and 1,000 nanometers.

15. The illumination device of claim 1, wherein each of the plurality of pillars is cylindrically shaped and has a diameter of between 100 nanometers and 300 nanometers.

16. The illumination device according to claim 1, wherein each of the plurality of dielectric pillars consists of titanium dioxide ($TiO_2$), titanium nitride (TiN) or silicon (Si).

17. The illumination device according to claim 1, wherein each of the plurality of pillars is cylindrically shaped and has a diameter of between 100 nanometers and 300 nanometers, a height of between 100 nanometers and 1,000 nanometers, and a mean center-to-center spacing between each of the plurality of pillars of between 300 and 500 nanometers.

18. An arrangement comprising:
    a substrate being a phosphor layer, wherein the phosphor layer is a flat plate and optically thick; and
    a plurality of dielectric sub-wavelength scattering pillars disposed on the substrate and arranged to form a dielectric aperiodic array with an aperiodic pattern, the plurality of dielectric pillars of the aperiodic pattern configured to cooperate to produce azimuthally isotropic scattering of incident luminescence to within a restricted angular cone,
    wherein the aperiodic array is configured to restrict illumination emissions to within the restricted angular cone, and
    wherein each of the plurality of dielectric pillars comprises a transparent dielectric.

19. The arrangement of claim 18, wherein the aperiodic array is a Vogel spiral.

20. The arrangement of claim 19, wherein a mean center-to-center spacing between each of the plurality of dielectric pillars is between 0.25 and 2.5 times a wavelength of the incident luminescence.

21. The arrangement of claim 19, wherein each of the plurality of dielectric pillars is cylinder shaped, cone shaped, pyramid shaped, or rectangular shaped.

22. The arrangement of claim 19, wherein each of the plurality of dielectric pillars is cylindrically shaped and has a height of between 100 nanometers and 1,000 nanometers and a diameter of between 100 nanometers and 300 nanometers.

23. The arrangement of claim 18, wherein the substrate comprises phosphor.

24. A method of manufacturing an arrangement, the method comprising:
  applying a pattern, to mark a plurality of sub-wavelength scattering pillars arranged in an aperiodic array, onto a substrate comprising a wavelength converting material arranged in a phosphor layer and arranged to emit light of a first wavelength responsive to incidence of light of a second, different, wavelength; and
  forming the plurality of sub-wavelength scattering pillars from the substrate,
  wherein the phosphor layer is a flat plate and optically thick,
  wherein each of the plurality of dielectric pillars comprises a transparent dielectric,
  wherein the aperiodic array is configured to restrict illumination emissions to within a restricted angular cone, and
  wherein the pattern of the plurality of sub-wavelength scattering pillars is configured to produce azimuthally isotropic scattering of incident luminescence within the restricted angular cone.

25. The method of claim 24, further comprising:
  depositing a dielectric material into the wavelength converting material; and
  etching the dielectric material to form the plurality of pillars.

26. The method of claim 24, wherein the aperiodic array is a Vogel spiral.

27. The method of claim 24, wherein each of the plurality of pillars is cylindrically shaped and has a height of between 100 nanometers and 1,000 nanometers and a diameter of between 100 nanometers and 300 nanometers, and wherein a mean center-to-center spacing between each of the plurality of pillars is between 0.25 and 2.5 times the first wavelength.

* * * * *